United States Patent
Tanaka et al.

(10) Patent No.: US 8,946,719 B2
(45) Date of Patent: Feb. 3, 2015

(54) TFT, SHIFT REGISTER, SCAN SIGNAL LINE DRIVING CIRCUIT, DISPLAY DEVICE, AND TFT TRIMMING METHOD

(75) Inventors: Shinya Tanaka, Osaka (JP); Tetsuo Kikuchi, Osaka (JP); Hajime Imai, Osaka (JP); Hideki Kitagawa, Osaka (JP); Yoshiharu Kataoka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 1154 days.

(21) Appl. No.: 12/736,222

(22) PCT Filed: Jan. 27, 2009

(86) PCT No.: PCT/JP2009/051236
§ 371 (c)(1),
(2), (4) Date: Sep. 21, 2010

(87) PCT Pub. No.: WO2009/150862
PCT Pub. Date: Dec. 17, 2009

(65) Prior Publication Data
US 2011/0012880 A1    Jan. 20, 2011

(30) Foreign Application Priority Data
Jun. 12, 2008   (JP) .................. 2008-154045

(51) Int. Cl.
*H01L 29/786* (2006.01)
*H01L 27/12* (2006.01)
(Continued)

(52) U.S. Cl.
CPC .............. *H01L 27/12* (2013.01); *C09G 3/3677* (2013.01); *H01L 27/1214* (2013.01); *H01L 28/86* (2013.01); *H01L 27/13* (2013.01)

USPC .................................. 257/71; 257/E29.345

(58) Field of Classification Search
USPC .......................................................... 257/68
See application file for complete search history.

(56) References Cited

U.S. PATENT DOCUMENTS

| 5,102,361 A | 4/1992 | Katayama et al. |
| 5,434,899 A | 7/1995 | Huq et al. |
| 5,701,136 A | 12/1997 | Huq et al. |

(Continued)

FOREIGN PATENT DOCUMENTS

| JP | 0-017614 | 1/1991 |
| JP | 8-087897 | 4/1996 |

(Continued)

OTHER PUBLICATIONS

Kah Yoong Chan et al., "Contact Effects in High Mobility Microcrystalline Silicon Thin-Film Transistors", Mater. Res. Soc. Symp. Proc., vol. 989, 2007, 0989-A11-03, 6 pages.

(Continued)

*Primary Examiner* — Chandra Chaudhari
(74) *Attorney, Agent, or Firm* — Harness, Dickey & Pierce, P.L.C.

(57) ABSTRACT

In at least one embodiment, a TFT includes: a first capacitor formed of a first capacitor electrode connected to a source electrode and a second capacitor electrode; a second capacitor formed of a third capacitor electrode and a fourth capacitor electrode; a first lead-out line; a second lead-out line connected to a gate electrode; a third lead-out line; a fourth lead-out line; a first interconnection; and a second interconnection. This realizes a TFT which can be easily saved from being a defective product even if leakage occurs in a capacitor connected to a TFT body section.

29 Claims, 10 Drawing Sheets

(51) Int. Cl.
H01L 49/02 (2006.01)
H01L 27/13 (2006.01)

(56) References Cited

U.S. PATENT DOCUMENTS

| | | | |
|---|---|---|---|
| 6,124,604 A * | 9/2000 | Koyama et al. | 257/59 |
| 7,112,458 B2 | 9/2006 | Shih et al. | |
| 7,112,459 B2 | 9/2006 | Chen | |
| 7,319,239 B2 * | 1/2008 | Tsubata et al. | 257/72 |
| 2003/0016196 A1 | 1/2003 | Lueder et al. | |
| 2005/0162893 A1 | 7/2005 | Yagi et al. | |
| 2005/0285151 A1 | 12/2005 | Kawasaki | |
| 2006/0145157 A1 | 7/2006 | Choi et al. | |
| 2008/0029767 A1 | 2/2008 | Nagata et al. | |
| 2008/0309841 A1 | 12/2008 | Yagi et al. | |

FOREIGN PATENT DOCUMENTS

| | | |
|---|---|---|
| JP | 2005-242307 | 9/2005 |
| JP | 3863215 | 10/2006 |
| JP | 2007-212812 | 8/2007 |
| RU | 1 762 690 C | 8/1994 |

OTHER PUBLICATIONS

Akihisa Matsuda, "Microcrystalline silicon growth and device application," Journal of Non-Crystalline Solids, 338-340 (2004), pp. 1-12.
U.S. Office Action issued in U.S. Appl. No. 12/736,158, dated Aug. 20, 2014.
Decision of Grant dated Aug. 21, 2012 issued in Russian Application No. 2010138946.
Abstract of JP8-263028, published on Oct. 11, 1996.

* cited by examiner

F I G. 8
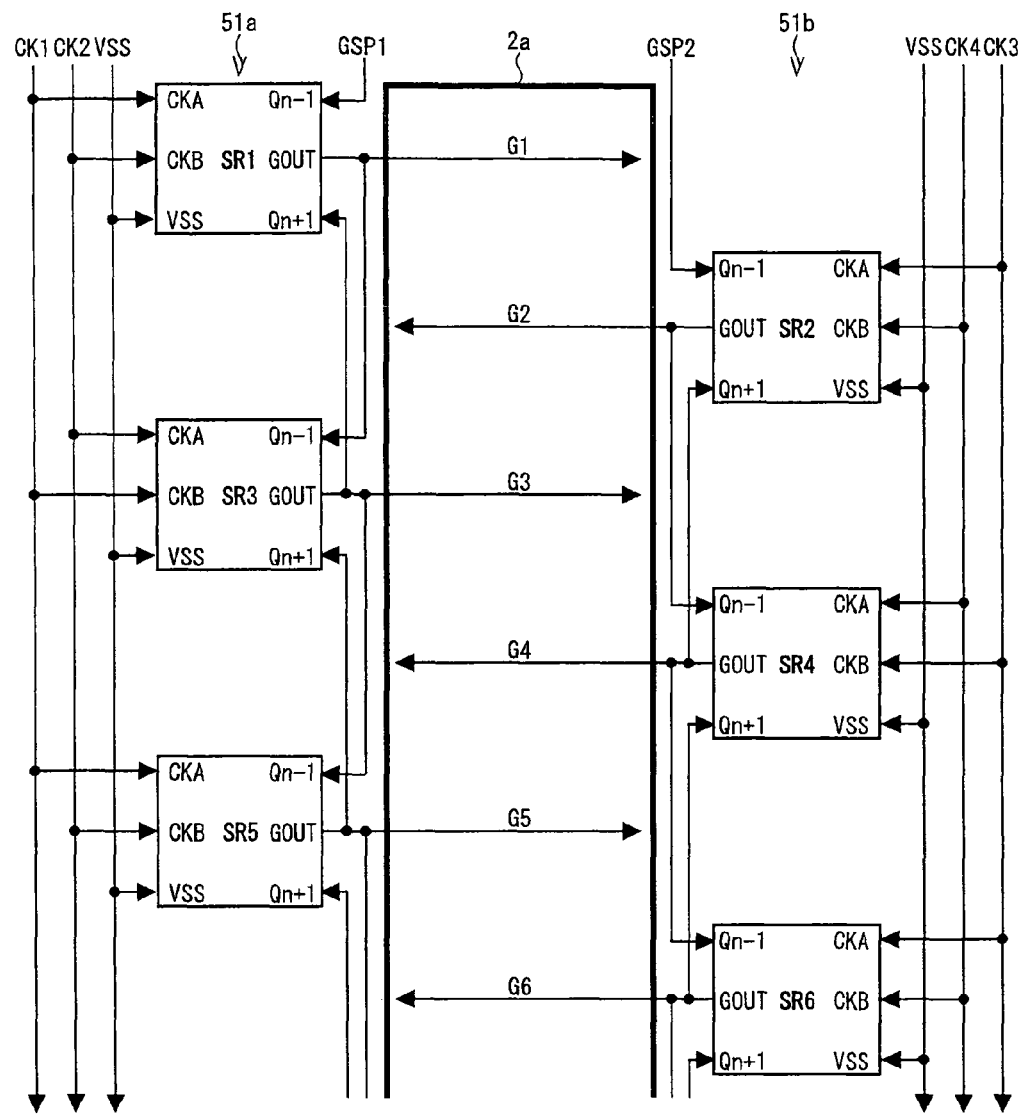

TFT, SHIFT REGISTER, SCAN SIGNAL LINE DRIVING CIRCUIT, DISPLAY DEVICE, AND TFT TRIMMING METHOD

TECHNICAL FIELD

The present invention relates to a TFT including a capacitor that is added between a gate and a source.

BACKGROUND ART

In recent years, monolithic integration of a gate driver has been developed for the purpose of cost reduction. In the monolithic integration, the gate driver is formed from amorphous silicon on a liquid crystal panel. The term "monolithic gate driver" is also associated with the terms such as "gate driver-free", "built-in gate driver in panel", and "gate in panel". For example, Patent Literature 1 discloses shift registers of monolithic gate drivers.

FIG. 11 shows circuit configuration of each shift register stage disclosed in Patent Literature 1.

The following describes essential structure and operations of this circuit. FIG. 11 shows the structure of an n-th stage of shift register stages cascaded with each other. To an input terminal 12, a gate output from a preceding stage is supplied. This supply causes an output transistor 16 to be turned ON through a drain of a transistor 18. A bootstrap capacitor 30 is connected between a gate and a source of the output transistor 16. When a clock signal C1 in High level is supplied to the output transistor 16 from its drain side during ON-state of the output transistor 16, a gate potential of the output transistor 16 sharply increases to a level greater than power source voltage due to capacitive coupling between the gate and source of the output transistor 16 through the bootstrap capacitor 30. This substantially decreases a resistance between the source and drain of the output transistor 16. Then, the clock signal C1 in High level is outputted to a gate bus line 118, and this gate output is supplied to an input of a subsequent stage.

FIG. 12 shows a plan view of elements used when such a bootstrap capacitor is built into a display panel.

A bootstrap capacitor 101b shown in FIG. 12, as part of a TFT 101, is connected to a TFT body section 101a. In a case where a display panel is made from amorphous silicon or the like material with lower mobility, it is a widespread practice that the TFTs monolithically built into the display panel are patterned to have a much larger channel width than standard for decrease in resistance between a source and drain of the TFT body section 101a. Therefore, the TFT body section 101a shown in FIG. 11 secures a large channel width, with such an arrangement that comb-shaped source electrode 102 and drain electrode 103 are arranged to be mutually opposed in such a manner that the source electrode 102 and the drain electrode 103 are engaged with each other. Under a region of the engagement between the source electrode 102 and the drain electrode 103, a gate electrode 104 is provided. The bootstrap capacitor 101b is formed such that a first capacitor electrode 102a led out from the source electrode 102 of the TFT body section 101a and a second capacitor electrode 104a led out from the gate electrode 104 of the TFT body section 101a are arranged to be stacked and mutually opposed across a gate dielectric layer therebetween.

In addition, the first capacitor electrode 102a is connected to an output OUT of a shift register stage, and the output OUT is connected to a gate bus line GL via a contact hole 105.

FIG. 13 shows a cross-sectional view taken along the line X-X' in FIG. 12.

As shown in the cross-sectional view of FIG. 13, the arrangement in FIG. 13 is such that: a gate metal GM, a gate dielectric layer 106, an i layer 107 formed from Si, an n+ layer 108 formed from Si, a source metal SM, and a passivation layer 109 are stacked on a glass substrate 100 in this order. The gate electrode 104, the second capacitor electrode 104a, and the gate bus line GL are all formed from the gate metal GM that has been formed in a concurrent manufacturing process. The source electrode 102, the drain electrode 103, and the first capacitor electrode 102a are all formed from the source metal SM that has been formed in the concurrent manufacturing process. The i layer 107 is a layer that serves as a channel forming region in the TFT body section 101a. The n+ layer 108 is provided as a source/drain contact layer between the i layer 107 and the source electrode 102 and between the i layer 107 and the drain electrode 103.

The above-described transistor including the bootstrap capacitor is also disclosed in Patent Literature 2, etc.

CITATION LIST

Patent Literature 1
Japanese Patent No. 3863215 (Registration Date: Oct. 6, 2006)
Patent Literature 2
Japanese Patent Application Publication, Tokukaihei, No. 8-87897 A (Publication Date: Apr. 2, 1996)

SUMMARY OF INVENTION

The conventional TFT provided with a bootstrap capacitor requires being large in size so that the TFT body section secures a large channel width, as described previously. Therefore, it is inevitable that manufacturing of TFTs with low yield seriously decreases a proportion of non-defective panels obtained. However, with increase of a load connected to an output of a TFT including the bootstrap capacitor, a capacitance value required for the bootstrap capacitor to obtain a satisfactory bootstrap effect increases. Accordingly, the bootstrap capacitor occupies a large area on a panel. A magnitude of such a capacitance value depends on circuit configuration and specification of a display panel. However, the capacitance value is equal to or greater than 3 pF for a 7-inch panel, for example. A greater screen size further increases the capacitance value. Therefore, the bootstrap capacitor 101b shown in FIG. 12 is extremely large in size. As an example is given a 7-inch WVGA display device with a monolithically fabricated gate driver which device performs gate scanning for three color lines of RGB under the condition where a capacitance value of the bootstrap capacitor 101b is 3 pF. Assume that a dot pitch in the gate scanning direction is 63 µm in an arrangement where the gate driver is disposed in one of two regions adjoining a display region, and a gate dielectric layer (SiNx) has a relative permittivity of 6.9 and has a layer thickness of 4100 Å. In this case, the bootstrap capacitor 101b is such that a side H along the gate scanning direction is 50 µm, and the other side W is 400 µm.

Such a large area occupied by the bootstrap capacitor results in a higher probability of the occurrence of leakage between two opposed electrodes of the bootstrap capacitor. If the bootstrap capacitor has leakage in at least one spot, the entire TFT fails to operate normally. This decreases manufacturing yield of TFTs and, in turn, seriously decreases manufacturing yield of display panels.

Thus, the conventional TFT provided with a bootstrap capacitor has the problem that it is liable to have lower manufacturing yield due to the occurrence of leakage in the bootstrap capacitor.

The present invention has been attained in view of the above program caused by the conventional arrangement, and an object thereof is to realize: a TFT which can be easily saved from being a defective product even if leakage occurs in the capacitor connected to the TFT body section; a shift register; a scan signal line driving circuit; a display device, all of which include the TFT; and a TFT trimming method.

In order to solve the above problem, a TFT of the present invention is a TFT comprising: a first capacitor formed so as to have a region where a first capacitor electrode connected to a source electrode and a second capacitor electrode are arranged to be stacked in a thickness direction and mutually opposed across a first dielectric layer therebetween; a second capacitor formed so as to have a region where a third capacitor electrode and a fourth capacitor electrode are arranged to be stacked in the thickness direction and mutually opposed across a second dielectric layer therebetween; a first lead-out line led out from the first capacitor electrode in a planar direction; a second lead-out line led out from a gate electrode in a planar direction; a third lead-out line out from the third capacitor electrode in a planar direction; a fourth lead-out line led out from the fourth capacitor electrode in a planar direction; a first interconnection intersecting the second lead-out line and the fourth lead-out line when viewed in the thickness direction; and a second interconnection intersecting the first lead-out line and the third lead-out line when viewed in the thickness direction, the second capacitor electrode and the gate electrode being connected to each other via the second lead-out line, the third capacitor electrode and the source electrode not being connected to each other, the fourth capacitor electrode and the gate electrode not being connected to each other.

As a method for trimming the above TFT is given a method comprising: causing separation between the second capacitor electrode and the gate electrode by fusing the second lead-out line, causing the first lead-out line and the third lead-out line to be connected to the second interconnection by welding; and causing the second lead-out line and the fourth lead-out line to be connected to the first interconnection by welding.

According to the above invention, the first capacitor is connected to the TFT body section so as to electrically function. In the event of occurrence of leakage in the first capacitor, the second capacitor electrode is separated from the second lead-out line by laser-fusing or the like method, so that the second capacitor electrode and the gate electrode are separated from each other. Then, connections of the second lead-out line and the fourth lead-out line to the first interconnection by laser-welding or the like method and connections of the first lead-out line and the third lead-out line to the second interconnection by laser-welding or the like method enable the second capacitor to be connected to the TFT body section so that the second capacitor electrically functions.

Thus, the occurrence of leakage in the first capacitor of the TFT does not mean a failure of the entire TFT. Such a TFT is serviceable with the second capacitor used as an alternative capacitor.

As described above, the present invention produces the effect of realizing a TFT which can be easily saved from being a defective product even if leakage occurs in the capacitor connected to the TFT body section.

In order to solve the above problem, a TFT of the present invention is a TFT comprising: a first capacitor formed so that a first capacitor electrode connected to a source electrode and a second capacitor electrode are arranged to be stacked in a thickness direction and mutually opposed across a first dielectric layer therebetween; a second capacitor formed so that a third capacitor electrode and a fourth capacitor electrode are arranged to be stacked in the thickness direction and mutually opposed across a second dielectric layer therebetween; a first lead-out line led out from the first capacitor electrode in a planar direction; a second lead-out line led out from a gate electrode in a planar direction; a third lead-out line led out from the third capacitor electrode in a planar direction; a fourth lead-out line led out from the fourth capacitor electrode in a planar direction; a first interconnection intersecting the second lead-out line and the fourth lead-out line when viewed in the thickness direction; and a second interconnection intersecting the first lead-out line and the third lead-out line when viewed in the thickness direction, the second capacitor electrode and the gate electrode not being connected to each other, the first lead-out line and the third lead-out line being connected to the second interconnection, whereby the third capacitor electrode and the source electrode are connected to each other, the second lead-out line and the fourth lead-out line being connected to the first interconnection, whereby the fourth capacitor electrode and the gate electrode are connected to each other.

According to the above invention, connection relationship is determined such that the second capacitor, which is selected from the first and second capacitors, is connected to the TFT body section so that the second capacitor functions electrically.

Thus, the occurrence of leakage in the first capacitor of the TFT does not mean a failure of the entire TFT. Such a TFT is serviceable with the second capacitor used as an alternative capacitor.

As described above, the present invention produces the effect of realizing a TFT which can be easily saved from being a defective product even if leakage occurs in the capacitor connected to the TFT body section.

In order to solve the above problem, a TFT of the present invention is such that the first capacitor electrode, the third capacitor electrode, the first lead-out line, the third lead-out line, and the first interconnection are formed from source metal, and the second capacitor electrode, the fourth capacitor electrode, the second lead-out line, the fourth lead-out line, and the second interconnection are formed from gate metal.

The above invention produces the effect of enabling easy formation of the first and second capacitors with use of a metallic material that is an original material for a TFT.

In order to solve the above problem, a TFT of the present invention is such that each of the first dielectric layer and the second dielectric layer is a gate dielectric layer.

The above invention produces the effect of enabling easy formation of the first and second capacitors with use of an insulating material that is an original material for a TFT.

In order to solve the above problem, a TFT of the present invention is a TFT comprising: a lead-out line connected to a source electrode; and a capacitor formed so as to have a region where a plurality of first capacitor electrodes and a second capacitor electrode connected to a gate electrode are arranged to be stacked in a thickness direction and mutually opposed across a dielectric layer therebetween, the plurality of first capacitor electrodes being led out from the lead-out line so as to be branched off from the lead-out line in a planar direction.

Further, as a method for trimming the above TFT is given a method of causing disconnection of at least one of the first capacitor electrodes from the lead-out line by fusing.

According to the above invention, capacitances provided between the first capacitor electrodes and the second capacitor electrode (hereinafter referred to as partial capacitance) are connected in parallel to each other. These capacitances constitute the total capacitance (hereinafter referred to as total capacitance). If these partial capacitances are sufficiently small as compared with the total capacitance, separation of a small number of the first capacitor electrodes with the leakage from the lead-out line by laser-fusing or the like method causes negligible difference in total capacitance between before and after separation of the first capacitor electrodes.

Thus, the occurrence of leakage in the capacitor of the TFT does not mean a failure of the entire TFT. Such a TFT is serviceable by repair to the capacitor.

As described above, the present invention produces the effect of realizing a TFT which can be easily saved from being a defective product even if leakage occurs in the capacitor connected to the TFT body section.

In order to solve the above problem, a TFT of the present invention is such that each of the first capacitor electrodes has: a pairing portion forming an opposing pair with the second electrode which is in the region of the capacitor; and a non-pairing portion with the second electrode such that the non-pairing portion extends from the lead-out line and leads to the pairing portion.

The above invention produces the effect of enabling easy separation of the first capacitor electrode with leakage by laser-fusing or the like method in the non-pairing portion.

In order to solve the above problem, a TFT of the present invention is such that a cutout is provided in the first capacitor electrode at a boundary between the non-pairing portion and the pairing portion and/or provided in the lead-out line at a place where the first capacitor electrode is branched off from the lead-out line.

The above invention produces the effect of enabling the use of the cutout as a marking for separation in separating the first capacitor electrode with leakage by laser-fusing or the like method in the non-pairing portion.

In order to solve the above problem, a TFT of the present invention is such that the first capacitor electrodes and the lead-out line are formed from source metal, and the second capacitor electrode is formed from gate metal.

The above invention produces the effect of enabling easy formation of the first and second capacitors with use of a metallic material that is an original material for a TFT.

In order to solve the above problem, a TFT of the present invention is such that the dielectric layer is a gate dielectric layer.

The above invention produces the effect of enabling easy formation of the first and second capacitors with use of an insulating material that is an original material for a TFT.

In order to solve the above problem, a TFT of the present invention is a TFT comprising: a first capacitor formed: so as to have a region where a first capacitor electrode connected to a source electrode and a second capacitor electrode are arranged to be stacked in a thickness direction and mutually opposed across a first dielectric layer therebetween; and so as to have a region where the first capacitor electrode and a third capacitor electrode are arranged to be stacked in the thickness direction and mutually opposed across a second dielectric layer therebetween with a coupling between the first capacitor electrode and the third capacitor electrode and a coupling between the first capacitor electrode and the second capacitor electrode formed over mutually opposite faces of the first capacitor electrode; a second capacitor formed: so as to have a region where a fourth capacitor electrode and a fifth capacitor electrode are arranged to be stacked in the thickness direction and mutually opposed across a third dielectric layer therebetween; and so as to have a region where the fourth capacitor electrode and a sixth capacitor electrode are arranged to be stacked in the thickness direction and mutually opposed across a fourth dielectric layer therebetween with a coupling between the fourth capacitor electrode and the sixth capacitor electrode and a coupling between the fourth capacitor electrode and the fifth capacitor electrode formed over mutually opposite faces of the fourth capacitor electrode; a first lead-out line led out from the first capacitor electrode in a planar direction; a second lead-out line led out from the second capacitor electrode in a planar direction; a gate lead-out line led out from a gate electrode in a planar direction; a third lead-out line led out from the third capacitor electrode in a planar direction; a fourth lead-out line led out from the fourth capacitor electrode in a planar direction; a fifth lead-out line led out from the fifth capacitor electrode in a planar direction; a first interconnection intersecting the gate lead-out line and the fifth lead-out line when viewed in the thickness direction; and a second interconnection intersecting the first lead-out line and the fourth lead-out line when viewed in the thickness direction, the third capacitor electrode and the gate electrode being connected to each other via the third lead-out line, the sixth capacitor electrode being connected to the fifth lead-out line, the second capacitor electrode and the gate electrode being connected to each other via the second lead-out line, the gate lead-out line and the fifth lead-out line not being connected to the first interconnection, the first lead-out line and the fourth lead-out line not being connected to the second interconnection.

Further, as a method for trimming the above TFT is given a method comprising: causing separation between the third capacitor electrode and the gate electrode by fusing the third lead-out line; causing the sixth capacitor electrode to be connected to the fifth lead-out line by welding; causing separation between the second capacitor electrode and the gate electrode by fusing the second lead-out line; causing the gate lead-out line and the fifth lead-out line to be connected to the first interconnection by welding; and causing the first lead-out line and the fourth lead-out line to be connected to the second interconnection by welding.

According to the above invention, the first capacitor is connected to the TFT body section so as to electrically function. In the event of occurrence of leakage in the first capacitor, the second capacitor electrode is separated from the gate electrode by subjecting the second lead-out line to laser-fusing or the like method, the third capacitor electrode is separated from the gate electrode by subjecting the third lead-out line to laser-fusing or the like method. Then, connections of the gate lead-out line and the fifth lead-out line to the first interconnection by laser-welding or the like method and connections of the first lead-out line and the fourth lead-out line to the second interconnection by laser-welding or the like method enable the second capacitor to be connected to the TFT body section so that the second capacitor electrically functions.

Thus, the occurrence of leakage in the first capacitor of the TFT does not mean a failure of the entire. TFT. Such a TFT is serviceable with the second capacitor used as an alternative capacitor.

As described above, the present invention produces the effect of realizing a TFT which can be easily saved from being a defective product even if leakage occurs in the capacitor connected to the TFT body section.

In order to solve the above problem, a TFT of the present invention is a TFT comprising: a first capacitor formed: so as to have a region where a first capacitor electrode connected to a source electrode and a second capacitor electrode are arranged to be stacked in a thickness direction and mutually opposed across a first dielectric layer therebetween; and so as to have a region where the first capacitor electrode and a third capacitor electrode are arranged to be stacked in the thickness direction and mutually opposed across a second dielectric layer therebetween with a coupling between the first capacitor electrode and the third capacitor electrode and a coupling between the first capacitor electrode and the second capacitor electrode formed over mutually opposite faces of the first capacitor electrode; a second capacitor formed: so as to have a region where a fourth capacitor electrode and a fifth capacitor electrode are arranged to be stacked in the thickness direction and mutually opposed across a third dielectric layer therebetween; and so as to have a region where the fourth capacitor electrode and a sixth capacitor electrode are arranged to be stacked in the thickness direction and mutually opposed across a fourth dielectric layer therebetween with a coupling between the fourth capacitor electrode and the sixth capacitor electrode and a coupling between the fourth capacitor electrode and the fifth capacitor electrode formed over mutually opposite faces of the fourth capacitor electrode; a first lead-out line led out from the first capacitor electrode in a planar direction; a second lead-out line led out from the second capacitor electrode in a planar direction; a gate lead-out line led out from a gate electrode in a planar direction; a third lead-out line led out from the third capacitor electrode in a planar direction; a fourth lead-out line led out from the fourth capacitor electrode in a planar direction; a fifth lead-out line led out from the fifth capacitor electrode in a planar direction; a first interconnection intersecting the gate lead-out line and the fifth lead-out line when viewed in the thickness direction; and a second interconnection intersecting the first lead-out line and the fourth lead-out line when viewed in the thickness direction, the third capacitor electrode and the gate electrode not being connected to each other, the sixth capacitor electrode being connected to the fifth lead-out line, the second capacitor electrode and the gate electrode not being connected to each other, the gate lead-out line and the fifth lead-out line being connected to the first interconnection, whereby the fifth capacitor electrode and the sixth electrode are connected to the gate electrode, the first lead-out line and the fourth lead-out line being connected to the second interconnection, whereby the fourth capacitor electrode and the source electrode are connected to each other.

According to the above invention, connection relationship is determined such that the second capacitor, which is selected from the first and second capacitors, is connected to the TFT body section so that the second capacitor functions electrically.

Thus, the occurrence of leakage in the first capacitor of the TFT does not mean a failure of the entire TFT. Such a TFT is serviceable with the second capacitor used as an alternative capacitor.

As described above, the present invention produces the effect of realizing a TFT which can be easily saved from being a defective product even if leakage occurs in the capacitor connected to the TFT body section.

In order to solve the above problem, a TFT of the present invention is such that the first capacitor electrode, the fourth capacitor electrode, the first lead-out line, the fourth lead-out line, and the first interconnection are formed from source metal, the second capacitor electrode, the fifth capacitor electrode, the second lead-out line, the fifth lead-out line, the gate lead-out line, and the second interconnection are formed from gate metal, and the third capacitor electrode, the sixth capacitor electrode, and the third lead-out line are formed from transparent electrodes.

The above invention produces the effect of enabling easy formation of the first and second capacitors with use of a metallic material that is an original material for a TFT.

In order to solve the above problem, a TFT of the present invention is such that each of the first dielectric layer and the third dielectric layer is a gate dielectric layer, and each of the second dielectric layer and the fourth dielectric layer is a passivation layer.

The above invention produces the effect of enabling easy formation of the first and second capacitors with use of an insulating material that is an original material for a TFT.

In order to solve the above problem, a TFT of the present invention is a TFT comprising: a lead-out line connected to a source electrode; and a capacitor formed: so as to have a region where a plurality of first capacitor electrodes and a second capacitor electrode connected to a gate electrode are arranged to be stacked in a thickness direction and mutually opposed across a first dielectric layer therebetween, the plurality of first capacitor electrodes being led out from the lead-out line so as to be branched off from the lead-out line in a planar direction; and so as to have a region where the first capacitor electrodes and a third capacitor electrode connected to the gate electrode are arranged to be stacked in the thickness direction and mutually opposed across a second dielectric layer therebetween with a coupling between the first capacitor electrodes and the third capacitor electrode and a coupling between the first capacitor electrodes and the second capacitor electrode formed over mutually opposite faces of the first capacitor electrode.

Further, as a method for trimming the above TFT is given a method of causing disconnection of at least one of the first capacitor electrodes from the lead-out line by fusing.

According to the above invention, capacitances provided between the first capacitor electrodes and the second capacitor electrode (hereinafter referred to as first partial capacitance) are connected in parallel to each other, and capacitances provided between the first capacitor electrodes and the third capacitor electrode (hereinafter referred to as second partial capacitance) are connected in parallel to each other. These capacitances constitute the total capacitance (hereinafter referred to as total capacitance). If a sum of the first and second partial capacitances is sufficiently small as compared with the total capacitance, separation of a small number of the first capacitor electrodes with the leakage from the lead-out line by laser-fusing or the like method causes negligible difference in total capacitance between before and after separation of the first capacitor electrodes.

Thus, the occurrence of leakage in the capacitor of the TFT does not mean a failure of the entire TFT. Such a TFT is serviceable by repair to the capacitor.

As described above, the present invention produces the effect of realizing a TFT which can be easily saved from being a defective product even if leakage occurs in the capacitor connected to the TFT body section.

In order to solve the above problem, a TFT of the present invention is such that each of the first capacitor electrodes has: a pairing portion forming an opposing pair with either of the second and third capacitor electrodes closer to the lead-out line which electrodes are in the region of the capacitor; and a non-pairing portion with the second and third electrodes such that the non-pairing portion extends from the lead-out line and leads to the pairing portion.

The above invention produces the effect of enabling easy separation of the first capacitor electrode with leakage by laser-fusing or the like method in the non-pairing portion.

In order to solve the above problem, a TFT of the present invention is such that a cutout is provided in the first capacitor electrode at a boundary between the non-pairing portion and the pairing portion and/or provided in the lead-out line at a place where the first capacitor electrode is branched off from the lead-out line.

The above invention produces the effect of enabling the use of the cutout as a marking for separation in separating the first capacitor electrode with leakage by laser-fusing or the like method in the non-pairing portion.

In order to solve the above problem, a TFT of the present invention is such that the first capacitor electrode and the lead-out line are formed from source metal, the second capacitor electrode is formed from gate metal, and the third capacitor electrode is formed from a transparent electrode.

The above invention produces the effect of enabling easy formation of the first and second capacitors with use of a metallic material that is an original material for a TFT.

In order to solve the above problem, a TFT of the present invention is such that the first dielectric layer is a gate dielectric layer, and the second dielectric layer is a passivation layer.

The above invention produces the effect of enabling easy formation of the first and second capacitors with use of an insulating material that is an original material for a TFT.

In order to solve the above problem, a TFT of the present invention is such that the TFT is manufactured with use of amorphous silicon.

The above invention produces the effect of preventing manufacturing yield of the entire TFT from seriously decreasing by improving the manufacturing yield of the capacitor of a TFT manufactured from amorphous silicon, because the TFT using amorphous silicon generally has a large channel width and is more likely to have lower manufacturing yield.

In order to solve the above problem, a TFT of the present invention is such that the TFT is manufactured with use of microcrystalline silicon.

A TFT using microcrystal silicon has higher mobility than an amorphous silicon TFT. As such, the above invention produces the effect of making the transistor size small in comparison with the amorphous silicon TFT. Moreover, using microcrystal silicon in a TFT realizes a small-footprint TFT, which is advantageous for a slim picture frame. It is also possible to curb variations in threshold voltage caused by application of DC biases.

In order to solve the above problem, a shift register of the present invention includes a plurality of stages composed of transistors, wherein at least one of the transistors is the above TFT.

The above invention produces the effect of enabling manufacturing of a shift register with high yield.

In order to solve the above problem, a scan signal line driving circuit of the present invention includes the above shift register, wherein the shift register is used to generate a scan signal for a display device.

The above invention produces the effect of enabling manufacturing of a scan signal line driving circuit with high yield.

In order to solve the above problem, a scan signal line driving circuit of the present invention is such that the TFT is an output transistor that outputs the scan signal.

The above invention produces the effect of enabling manufacturing of a TFT for which high driving ability is required with high yield, by using the TFT as an output transistor that outputs a scan signal.

In order to solve the above problem, a display device of the present invention comprises the above scan signal line driving circuit.

The above invention produces the effect of enabling manufacturing of a display device with high yield.

In order to solve the above problem, a display device of the present invention is such that the scan signal line driving circuit is formed on a display panel so as to be monolithically integrated with a display region.

The above invention produces the effect that it can make up for the disadvantages that the display device requires a large capacitance and that the TFT cannot help but having a large channel width. Consequently, it is possible to manufacture, with high yield, a display device in which the scan signal line driving circuit is formed on the display panel so as to be monolithically integrated with the display region.

In order to solve the above problem, a display device of the present invention comprises a display panel in which the above TFT is formed.

The above invention produces the effect of realizing a display device which can be easily saved from being a defective product even if leakage occurs in the capacitor connected to the TFT body section.

Additional objects, features, and strengths of the present invention will be made clear by the description below. Further, the advantages of the present invention will be evident from the following explanation in reference to the drawings.

BRIEF DESCRIPTION OF DRAWINGS

FIG. 8 is a circuit block diagram showing the structure of a shift register included in the display device shown in FIG. 7.

REFERENCE SIGNS LIST

Figure 1:
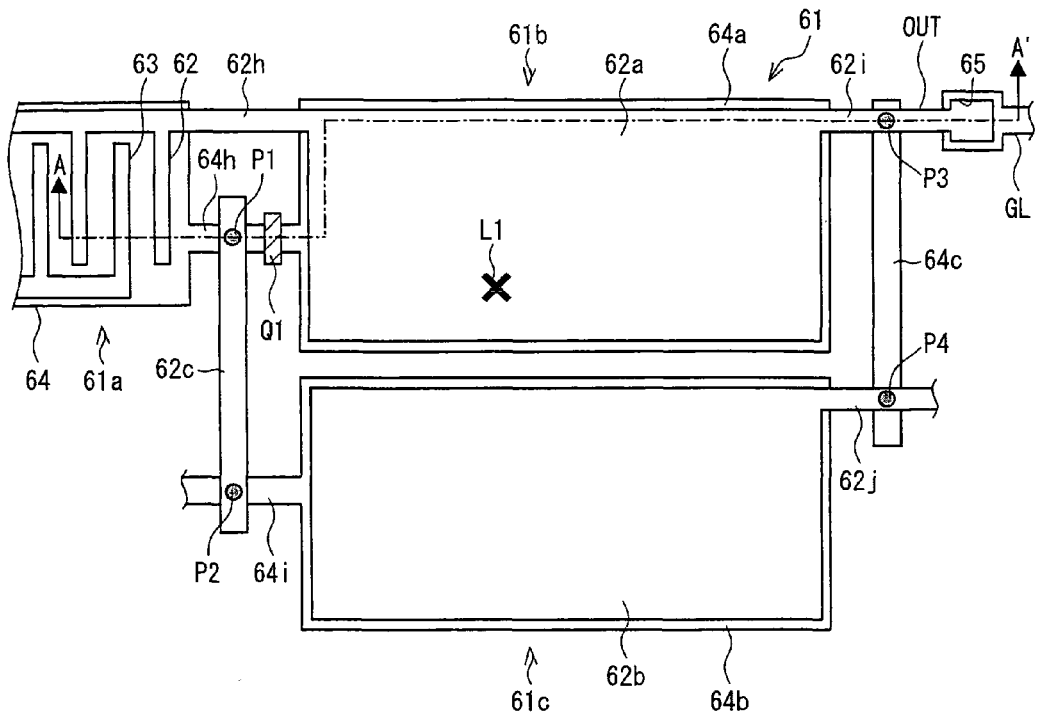
FIG. 1 is a plan view showing an embodiment of the present invention and showing the structure of a TFT according to a first example.

1 Liquid crystal display device (display device)
61, 71, 81, and 91 TFTs
61*b* Capacitor (first capacitor)
61*c* Capacitor (second capacitor)
62 Source electrode 64 Gate electrode
62a First capacitor electrode
64a Second capacitor electrode
62b Third capacitor electrode
64b Fourth capacitor electrode
62i Lead-out line (first lead-out line)
64h Lead-out line (second lead-out line)
62j Lead-out line (third lead-out line)
64i Lead-out line (fourth lead-out line)
66 Gate dielectric layer (first dielectric layer, second dielectric layer, and dielectric layer)
71a Capacitor
72h Lead-out line
72a First capacitor electrode
74a Second capacitor electrode
73, 74, and 75 Cutouts
81b Capacitor (first capacitor)
81c Capacitor (second capacitor)
82 Source electrode
84 Gate electrode
82a First capacitor electrode
84a Second capacitor electrode
80a Third capacitor electrode
82b Fourth capacitor electrode
84b Fifth capacitor electrode
80b Sixth capacitor electrode
82i Lead-out line (first lead-out line)
84h Lead-out line (second lead-out line)
80c Lead-out line (third lead-out line)
84d Lead-out line (gate lead-out line)
82j Lead-out line (fourth lead-out line)
84e Lead-out line (fifth lead-out line)
86 Gate dielectric layer (first dielectric layer, third dielectric layer)
89 Passivation layer (second dielectric layer, fourth dielectric layer)
91a Capacitor
92h Lead-out line
92a First capacitor electrode
94a Second capacitor electrode
90a Third capacitor electrode
93, 94, 95 Cutouts
Tr4 Transistor (TFT)
CAP Capacitor (first capacitor and second capacitor)

DESCRIPTION OF EMBODIMENTS

The following will describe one embodiment of the present invention with reference to FIGS. 1 through 10.

Figure 7:
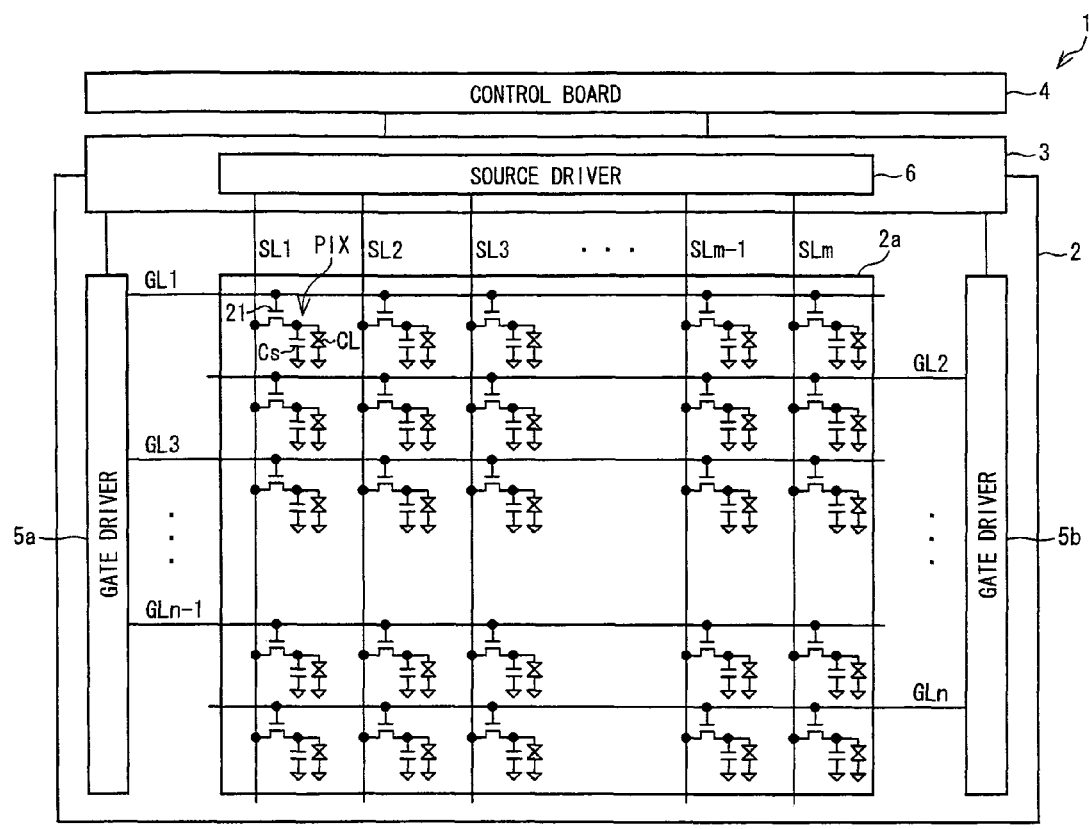
FIG. 7 is a block diagram showing an embodiment of the present invention and showing the structure of a display device.

FIG. 7 shows the configuration of a liquid crystal display device 1 that is a display device according to the present embodiment.

The liquid crystal display device 1 includes a display panel 2, a flexible printed circuit board 3, and a control board 4.

The display panel 2 is an active matrix display panel arranged such that, using amorphous silicon, polycrystalline silicon, CG silicon, microcrystalline silicon, or the like silicon, a display region 2a, a plurality of gate bus lines GL, a plurality of source bus lines SL, and gate drivers 5a and 5b are built onto a glass substrate. The display region 2a is a region where a plurality of pixels PIX are arranged in a matrix manner. Each of the pixels PIX includes a TFT 21 that is a selection element of the pixel PIX, a liquid crystal capacitor CL, and an auxiliary capacitor Cs. A gate of the TFT 21 is connected to the gate bus line GL, and a source of the TFT 21 is connected to the source bus line SL. The liquid crystal capacitor CL and auxiliary capacitor Cs are connected to a drain of the TFT 21.

The plurality of gate bus lines GL are gate bus lines GL1, GL2, GL3, ... and GLn. Among these, the gate bus lines GL in a first group consisting of the alternate gate bus lines GL1, GL3, GL5, ... are connected to respective outputs of the gate driver 5a, and the gate bus lines GL in a second group consisting of the other alternate gate bus lines GL2, GL4, GL6, ... are connected to respective outputs of the gate driver 5b. The plurality of source bus lines SL are source bus lines SL1, SL2, SL3, ... SLm, which are connected to respective outputs of a source driver 6 that will be described later. Although not shown, an auxiliary capacitor line is formed to apply an auxiliary capacitor voltage to each of the auxiliary capacitors Cs of the pixels PIX.

The gate driver 5a is provided in one of two regions adjoining the display region 2a of the display panel 2 in a direction in which the gate bus lines GL extend, and sequentially supplies a gate pulse to each of the gate bus lines GL1, GL3, GL5, ... of the first group. The gate driver 5b is provided in the other region adjoining the display region 2a of the display panel 2, and sequentially supplies a gate pulse to each of the gate bus lines GL2, GL4, GL6, ... of the second group. These gate drivers 5a and 5b are built into the display panel 2 so as to be monolithically integrated with the display region 2a. Examples of the gate drivers 5a and 5b can include all gate drivers referred to with the terms such as "monolithic gate driver", "gate driver-free", "built-in gate driver in panel", and "gate in panel".

The flexible printed circuit board 3 includes the source driver 6. The source driver 6 supplies a data signal to each of the source bus lines SL. The control board 4 is connected to the flexible printed circuit board 3 and supplies necessary signals and power to the gate drivers 5a and 5b and the source driver 6. The signals and power to be supplied to the gate drivers 5a and 5b from the control board 4 pass through the flexible printed circuit board 3 and are then supplied to the gate driver 15 on the display panel 2.

FIG. 8 shows the configurations of the respective gate drivers 5a and 5b.

The gate driver 5a includes a first shift register 51a having a plurality of cascaded shift register stages SR (SR1, SR3, SR5, ...) therein. Each of the shift register stages SR includes a set input terminal Qn−1, an output terminal GOUT, a reset input terminal Qn+1, clock input terminals CKA and CKB, and a Low power source input terminal VSS. From the control board 4 are supplied a clock signal CK1, a clock signal CK2, a gate start pulse GSP1, and Low power source VSS (For convenience of explanation, the same reference sign as that for the Low power source input terminal VSS is used). The Low power source VSS may be at negative potential, at ground potential, or at positive potential. However, the Low power source VSS is herein assumed at negative potential to ensure OFF state of the TFTs.

In the first shift register 51a, an output from the output terminal GOUT of a j-numbered (j=1, 2, 3, ..., i=1, 3, 5, ..., j=(i+1)/2) shift register stage SRi is a gate output Gi to be outputted to an i-th gate bus line GLi.

To the set input terminal Qn−1 of a first shift register stage SR1 that lies at one of opposite ends in the scanning direction, the gate start pulse GSP1 is supplied. To the respective set input terminals Qn−1 of the j-numbered second and succeeding shift register stages SRi, gate outputs Gi−2 of preceding shift register stages SRi−2 are supplied. Further, to the respective reset input terminals Qn+1 thereof, gate outputs Gi+2 of subsequent shift register stages SRi+2 are supplied.

In the alternate j-numbered shift register stages SR that start from the first shift register stage SR1, the clock signal CK1 is supplied to the clock input terminals CKA, and the clock signal CK2 is supplied to the clock input terminals CKB. In the alternate j-numbered shift register stages SR that start from the second shift register stage SR3, the clock signal CK2 is supplied to the clock input terminals CKA, and the clock signal CK1 is supplied to the clock input terminals CKB. In this manner, the first and second stages are aligned alternately in the first shift register 51a.

Figure 9:
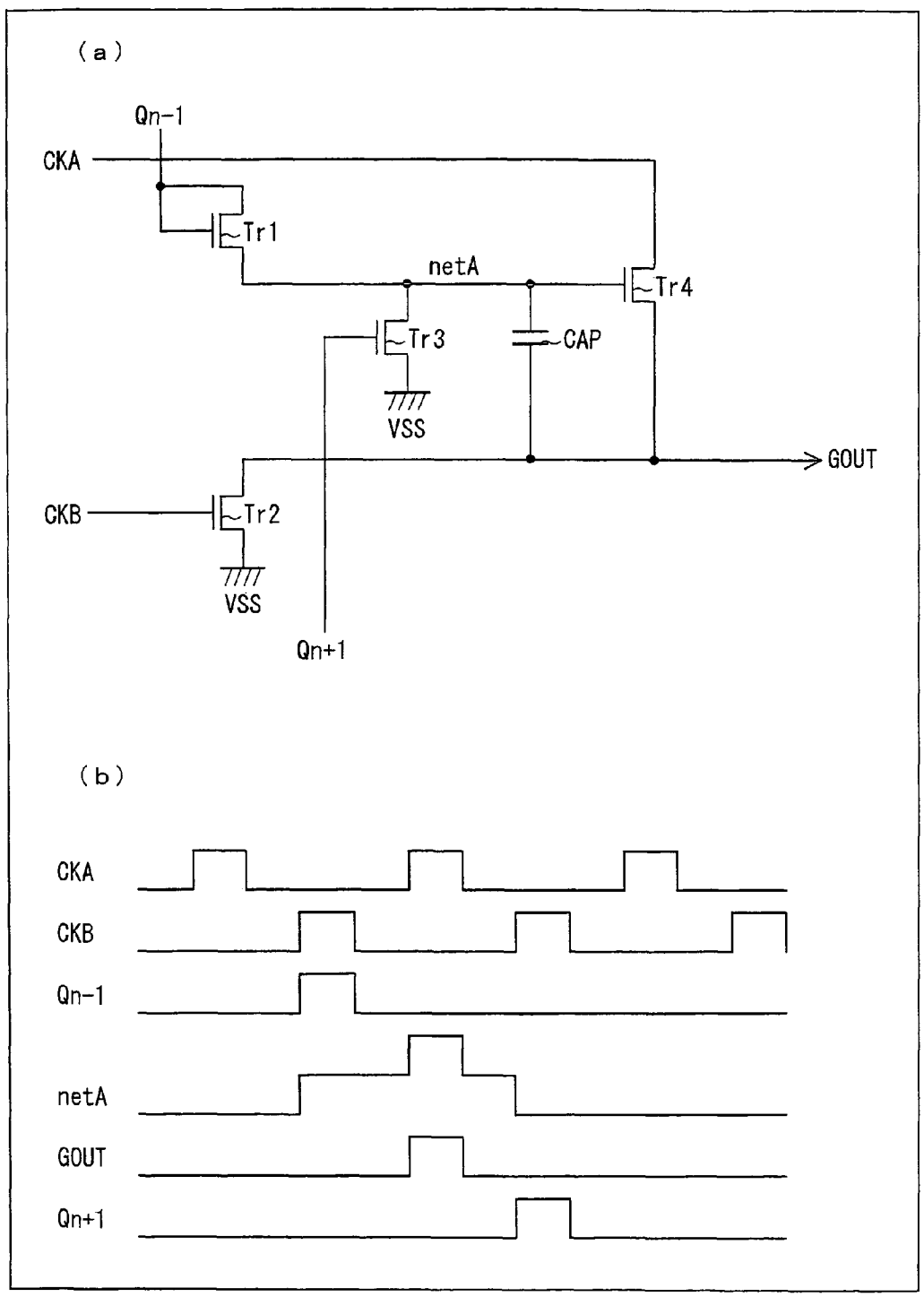
FIG. 9 is an explanatory view of a shift register stage included in the shift register shown in FIG. 8, wherein (a) is a circuit diagram showing the structure of the shift register stage, and (b) is a timing chart showing operations of the circuit shown in (a).

The clock signals CK1 and CK2 have waveforms as shown in (b) of FIG. 9 (see CKA and CKB for CK1 and CK2, respectively). The clock signals CK1 and CK2 are arranged so that their clock pulses do not overlap each other. In addition, timings for the clock signals CK1 and CK2 are such that the clock pulse of the clock signal CK1 appears after a one clock pulse delay subsequent to the clock pulse of the clock signal CK2, and the clock pulse of the clock signal CK2 appears after a one clock pulse delay subsequent to the clock pulse of the clock signal CK1.

The gate driver 5b includes a second shift register 51b having a plurality of cascaded shift register stages SR (SR2, SR4, SR6, . . . ) therein. Each of the shift register stages SR includes a set input terminal Qn−1, an output terminal GOUT, a reset input terminal Qn+1, clock input terminals CKA and CKB, and a Low power source input terminal VSS. From the control board 4 are supplied a clock signal CK3, a clock signal CK4, a gate start pulse GSP2, and the Low power source VSS.

In the second shift register 51b, an output from the output terminal GOUT of a k-numbered (k=1, 2, 3, . . . , i=2, 4, 6, . . . , k=i/2) shift register stage SRi is a gate output Gi to be outputted to an i-th gate bus line GLi.

To the set input terminal Qn−1 of a first shift register stage SR2 that lies at one of opposite ends in the scanning direction, the gate start pulse GSP2 is supplied. To the respective set input terminals Qn−1 of the k-numbered second and succeeding shift register stages SRi, gate outputs Gi−2 of preceding shift register stages SRi−2 are supplied. Further, to the respective reset input terminals Qn+1 thereof, gate outputs Gi+2 of subsequent shift register stages SRi+2 are supplied.

In the alternate k-numbered shift register stages SR that start from the first shift register stage SR2, the clock signal CK3 is supplied to the clock input terminals CKA, and the clock signal CK4 is supplied to the clock input terminals CKB. In the alternate k-numbered shift register stages SR that start from the second shift register stage SR4, the clock signal CK4 is supplied to the clock input terminals CKA, and the clock signal CK3 is supplied to the clock input terminals CKB. In this manner, the third and fourth stages are aligned alternately in the second shift register 51b.

The clock signals CK3 and CK4 have waveforms as shown in (b) of FIG. 9 (see CKA and CKB for CK3 and CK4, respectively). The clock signals CK3 and CK4 are arranged so that their clock pulses do not overlap each other. In addition, timings for the clock signals CK3 and CK4 are such that the clock pulse of the clock signal CK3 appears after a one clock pulse delay subsequent to the clock pulse of the clock signal CK4, and the clock pulse of the clock signal CK4 appears after a one clock pulse delay subsequent to the clock pulse of the clock signal CK3.

Figure 10:
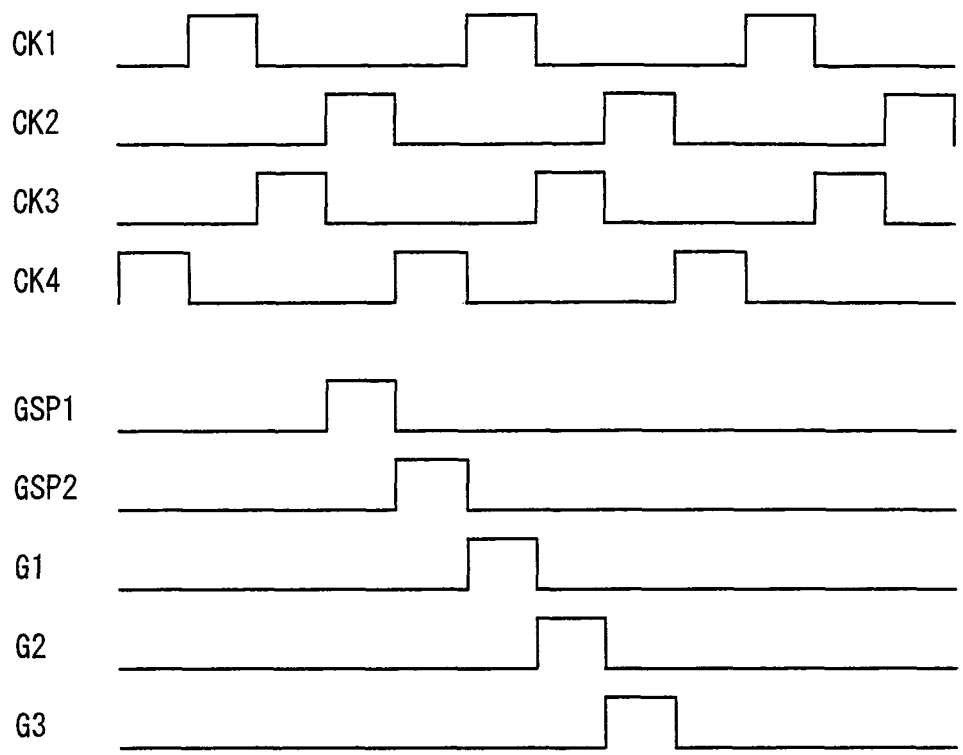
FIG. 10 is a timing chart showing operations of the shift register shown in FIG. 8.
Figure 11:
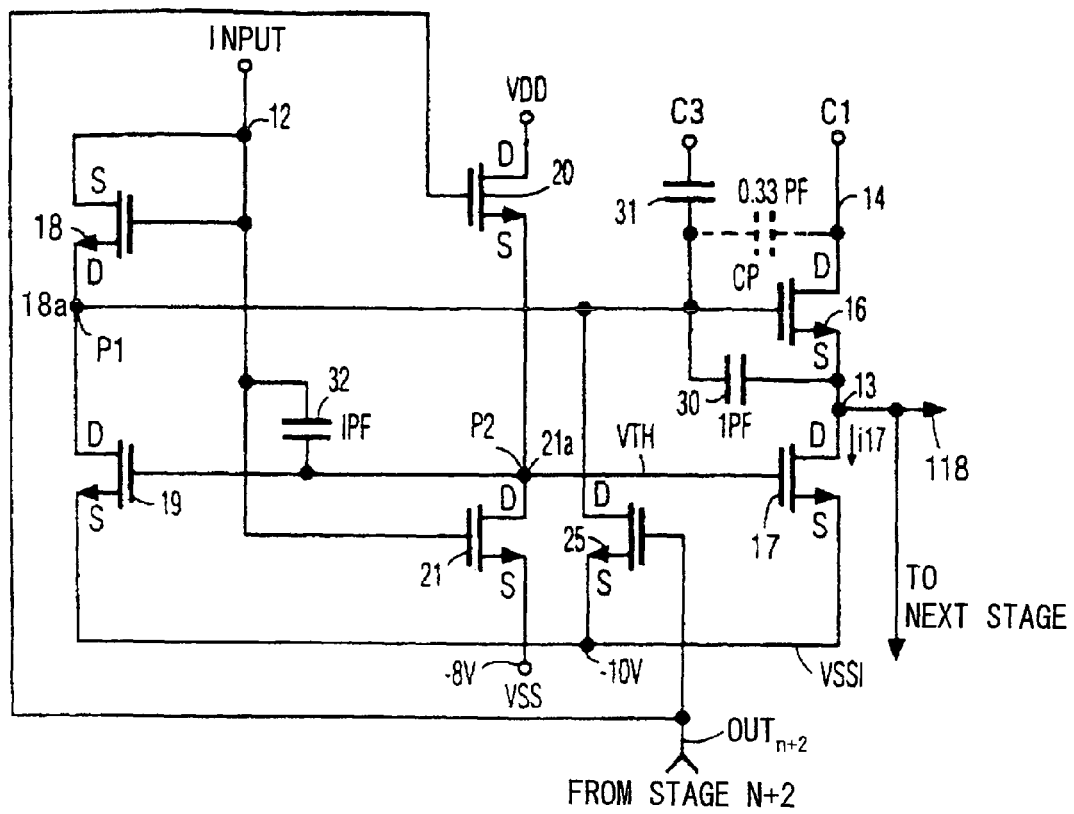
FIG. 11 is a circuit diagram showing the conventional art and showing the structure of a shift register stage.

Further, as shown in FIG. 10, the clock signals CK1, CK2, CK3, and CK4 are out of sync with each other. Timings for the clock signals CK1, CK2, CK3, and CK4 are such that the clock pulse of the clock signal CK1 appears subsequently to the clock pulse of the clock signal CK4, the clock pulse of the clock signal CK3 appears subsequently to the clock pulse of the clock signal CK1, the clock pulse of the clock signal CK2 appears subsequently to the clock pulse of the clock signal CK3, and the clock pulse of the clock signal CK4 appears subsequently to the clock pulse of the clock signal CK2.

As shown in FIG. 10, the gate start pulses GSP1 and GSP2 are pulses such that the gate start pulse GSP1 precedes the gate start pulse GSP2 and the gate start pulses GSP1 and GSP2 are adjacent to each other. The pulse of the gate start pulse GSP1 is in synchronism with the clock pulse of the clock signal CK2, and the pulse of the gate start pulse GSP2 is in synchronism with the clock pulse of the clock signal CK4.

Next, the following will describe the configuration of the shift register stage SRi of the shift registers 51a and 51b with reference to (a) of FIG. 9.

The shift register stage SRi includes transistors Tr1, Tr2, Tr3, and Tr4. Particularly, the transistor Tr4 includes a capacitor CAP that is a bootstrap capacitor. These transistors are all n-channel type TFTs.

As to the transistor Tr1, a gate and a drain are connected to a set input terminal Qn−1, and a source is connected to a gate of the transistor Tr4. As to the transistor Tr4, a drain is connected to a clock input terminal CKA, and a source is connected to an output terminal GOUT. That is, the transistor Tr4 serves as a transfer gate to perform passage and interruption of a clock signal to be supplied to the clock input terminal CKA. The capacitor CAP is provided between the gate and the source of the transistor Tr4. A node that is set to the same potential as the gate of the transistor Tr4 is referred to as a netA.

As to the transistor Tr2, a gate is connected to the clock input terminal CKB, a drain is connected to the output terminal GOUT, and a source is connected to the Low power source input terminal VSS. As to the transistor Tr3, a gate is connected to the reset input terminal Qn+1, a drain is connected to the node netA, and a source is connected to the Low power source input terminal VSS.

Next, with reference to (b) of FIG. 9, the following will describe the operations of the shift register stage SRi configured as shown in (a) of FIG. 9.

When a shift pulse is supplied to the set input terminal Qn−1, the transistor Tr1 is turned ON, which charges the capacitor CAP. For the shift register stages SR1 and SR2, the shift pulse corresponds to the gate start pulses GSP1 and GSP2, respectively. For the other shift register stages SRi, the shift pulse corresponds to gate outputs Gj−1 and Gk−1 from preceding shift register stages. Charging of the capacitor CAP increases a potential of the node netA and causes the transistor Tr4 to be turned ON. This causes the clock signal supplied through the clock input terminal CKA to appear in the source of the transistor Tr4. At the instant when the subsequent clock pulse is supplied to the clock input terminal CKA, the potential of the node netA rapidly increases due to the bootstrap effect of the capacitor CAP, and the incoming clock pulse is transferred to the output terminal GOUT of the shift register stage SRi and outputted from the output terminal GOUT as a gate pulse.

When the supply of the gate pulse to the set input terminal Qn−1 is completed, the transistor Tr4 is turned OFF. Then, in order to release charge retention caused by floating of the node netA and the output terminal GOUT of the shift register stage SRi, the transistor Tr3 is turned ON by a reset pulse supplied to the reset input terminal Qn+1. This causes the node netA and the output terminal GOUT to be set to a potential of the Low power source VSS.

Thereafter, until the shift pulse is supplied to the set input terminal Qn−1 again, the transistor Tr2 is periodically turned ON by the clock pulse supplied to the clock input terminal CKB. This refreshes the node netA and the output terminal GOUT of the shift register stage SRi with Low power source potential, i.e. sinks the gate bus line GLi voltage down.

In this manner, the gate pulses are sequentially outputted to the gate bus lines G1, G2, G3, and the like as shown in FIG. 10.

Next, the structures of elements applied to the transistor Tr4 in (a) of FIG. 9 will be described with Examples.

Example 1

Figure 2:
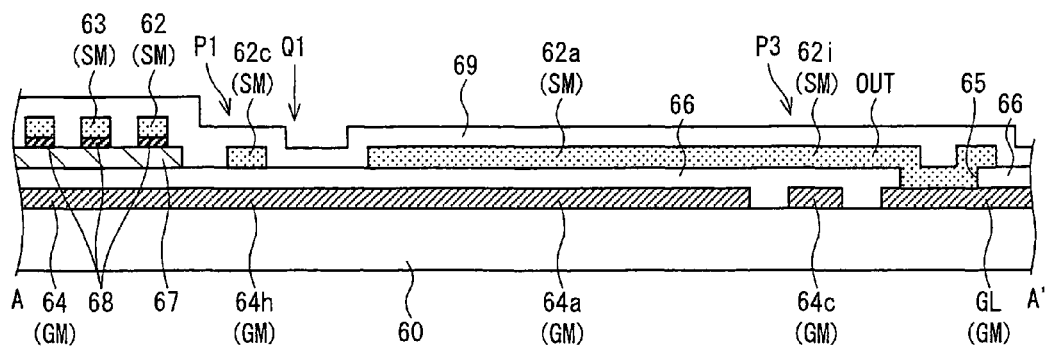
FIG. 2 is a cross-sectional view taken along the line A-A' in FIG. 1.

The following will describe a TFT of the present example with reference to FIGS. 1 and 2.

FIG. 1 shows a plan view of the structure of a TFT 61 applicable to the transistor Tr4 and provided on the display panel 2, according to the present example.

The TFT 61 includes a TFT body section 61a, capacitors 61b and 61c, and interconnections 62c and 64c. Each of the capacitors 61b and 61c is a capacitor capable of serving as a bootstrap capacitor and applicable to the capacitor CAP.

The TFT body section 61a has a comb-shaped source electrode 62 and a comb-shaped drain electrode 63 disposed above a gate electrode 64 in a thickness direction and opposed to each other in a panel plane in such a manner that the source electrode 62 and drain electrode 63 are engaged with each other, which secures a large channel width. However, this is merely one arrangement example. The source electrode 62, the drain electrode 63, and the gate electrode 64 may be disposed at any positions with any shapes.

The capacitor (first capacitor) 61b is formed so as to have a region where a first capacitor electrode 62a and a second capacitor electrode 64a are arranged to be stacked in the thickness direction and mutually opposed across a gate dielectric layer (first dielectric layer, see FIG. 2) 66 therebetween. The first capacitor electrode 62a is formed so as to be led out from the source electrode 62 of the TFT body section 61a through a lead-out line 62h in a planar direction. The second capacitor electrode 64a is formed so as to be led out from the gate electrode 64 of the TFT body section 61a through a lead-out line (second lead-out line) 64h in a planar direction.

The first capacitor electrode 62a is connected to an output OUT of the shift register stage SR via a lead-out line (first lead-out line) 62i in a planar direction. The output OUT is connected via a contact hole 65 to the gate bus line GL which lies at a lower position in the thickness direction.

The capacitor (second capacitor) 61c is disposed adjacent to the capacitor 61b and formed so as to have a region where a third capacitor electrode 62b and a fourth capacitor electrode 64b are arranged to be stacked in the thickness direction and mutually opposed across a gate dielectric layer (second dielectric layer) 66 therebetween. The first dielectric layer and the second dielectric layer may be dielectric layers different from each other. In this case, the capacitors 61b and 61c are designed so as to have the same value of capacitance. From the third capacitor electrode 62b, a lead-out line (third lead-out line) 62j is led out in a planar direction. From the fourth capacitor electrode 64b, a lead-out line (fourth lead-out line) 64i is led out in a planar direction.

The interconnection (first interconnection) 62c is provided so as to intersect both of the lead-out lines 64h and 64i at upper positions in the thickness direction. The interconnection (second interconnection) 64c is provided so as to intersect both of the lead-out lines 62i and 62j at lower positions in the thickness direction.

FIG. 2 shows a cross-sectional view taken along the line A-A' in FIG. 1.

As shown in the cross-sectional view in FIG. 2, the arrangement in FIG. 1 is such that: a gate metal GM, the gate dielectric layer 66, an i layer 67 formed from Si, an n+ layer 68 formed from Si, a source metal SM, and a passivation layer 69 are stacked on a glass substrate 60 in this order. The gate electrode 64, the second capacitor electrode 64a, the lead-out line 64h, the interconnection 64c, and the gate bus line GL are all formed from the gate metal GM that has been formed in a concurrent manufacturing process. For example, the gate metal GM can be used in a single layer of Ta (or TaN), Ti (or TiN), Al (or an alloy whose major component is Al), Mo (or MoN), or Cr or used in a stack with any combinations of these metals. The source electrode 62, the drain electrode 63, the first capacitor electrode 62a, the lead-out line 62i, and the interconnection 62c are all formed from the source metal SM that has been formed in the concurrent manufacturing process. The source metal SM can be formed from the same material(s) as the material(s) for the gate metal GM. For example, the source metal SM can be used in a single layer of Ta (or TaN), Ti (or TiN), Al (or an alloy whose major component is Al), Mo (or MoN), or Cr or used in a stack with any combinations of these metals. The i layer 67 is a layer that serves as a channel forming region in the TFT body section 61a. The n+ layer 68 is provided as a source/drain contact layer between the i layer 67 and the source electrode 62 and between the i layer 67 and the drain electrode 63.

Besides, in FIG. 1, the fourth capacitor electrode 64b and the lead-out line 64i are formed from the gate metal GM, and the third capacitor electrode 62b and the lead-out line 62j are formed from the source metal SM.

As the gate dielectric layer 66, for example, SiN, SiO$_2$, or the like material can be used. As the passivation layer 69, for example, SiN, SiO$_2$, an organic resin film, or the like material can be used.

As to the TFT 61 arranged as above, during the manufacture of the TFT 61, the capacitor 61b is electrically connected to the TFT body section 61a through the lead-out lines 62h and 64h, while the capacitor 61c is not electrically connected to the TFT body section 61a since the third capacitor electrode 62b and the fourth capacitor electrode 64b are not connected to the source electrode 62 and the gate electrode 64, respectively. If it is found out by an inspection conducted after manufacturing that leakage has occurred due to a leakage defect L1 between the first capacitor electrode 62a and the second capacitor electrode 64a or the like defect, no voltage is applied across the capacitor 61b through both of the lead-out lines 62h and 64h, and the capacitor 61c is made electrically connected to the TFT body section 61a through the lead-out line 62j and the interconnection 64c and through the lead-out line 64i and the interconnection 62c. The inspection may be an electrical inspection or a visual inspection.

Specifically, the interconnection 62c and the lead-out lines 64h and 64i are made connected to each other at intersection points P1 and P2 by laser welding, so that the fourth capacitor electrode 64b is connected to the gate electrode 64, and the interconnection 64c and the lead-out lines 62i and 62j are made connected to each other at intersection points P3 and P4 by laser welding so that the third capacitor electrode 62b is connected to the source electrode 62. Further, the lead-out line 64h is subjected to laser fusing at a point Q1 between the second capacitor electrode 64a and the intersection point P1, so that the second capacitor electrode 64a is separated from the lead-out line 64h. As such, the second capacitor electrode 64a is separated from the gate electrode 64.

Thus, the occurrence of leakage in the capacitor 61b does not mean a failure of the entire TFT 61. Such a TFT 61 is serviceable with the capacitor 61c used as an alternative bootstrap capacitor.

Note that the alternative capacitor like the capacitor 61c is not limited to one alternative capacitor. Alternatively, a plurality of alternative capacitors may be provided. In this case, one available alternative capacitor can be selected from among them for use at the occurrence of leakage.

Example 2

A TFT of the present example will be described with reference to FIG. 3. Unless otherwise noted, members given the same reference numerals as those shown in FIGS. 1 and 2 have the same functions as the members in FIGS. 1 and 2.

Figure 3:
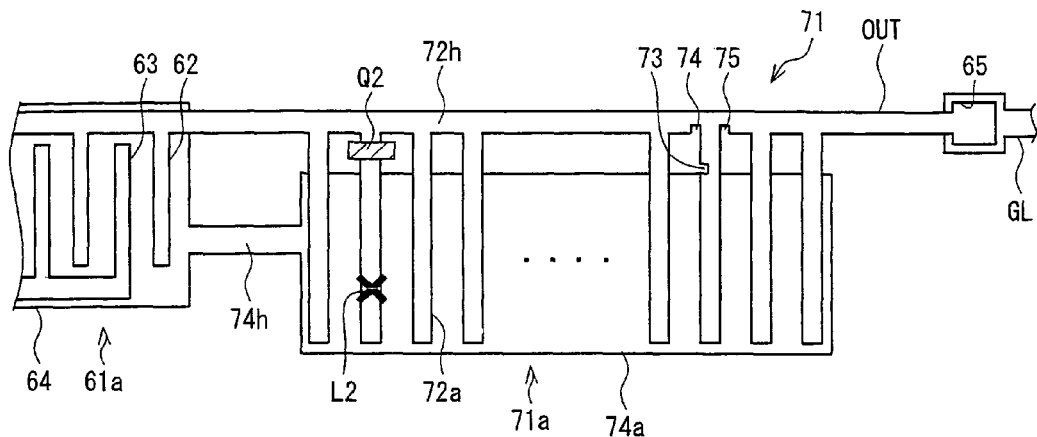
FIG. 3 is a plan view showing an embodiment of the present invention and showing the structure of a TFT according to a second example.

FIG. 3 shows a plan view of the structure of a TFT 71 applicable to the transistor Tr4 and provided on the display panel 2, according to the present example.

The TFT 71 includes a TFT body section 61a, a capacitor 71a, and interconnections 72h and 74h. The capacitor 71a is a capacitor capable of serving as a bootstrap capacitor and applicable to the capacitor CAP.

The capacitor 71a is formed so as to have a region where a plurality of first capacitor electrodes 72a and a second capacitor electrode 74a are arranged to be stacked in the thickness direction and mutually opposed across a gate dielectric layer 66 therebetween. The plurality of first capacitor electrodes 72a are formed so as to be led out from the lead-out line 72h, which is led out from the source electrode 62 of the TFT body section 61a, and to be branched off in a comb-like manner in a planar direction. The second capacitor electrode 74a is formed so as to be led out from the gate electrode 64 of the TFT body section 61a through the interconnection 74h.

The lead-out line 72h is connected to an output OUT of the shift register stage SR, and the output OUT is connected via a contact hole 65 to the gate bus line GL which lies at a lower position in the thickness direction.

The plurality of first capacitor electrode 72a and the lead-out line 72h are formed from source metal SM, and the second capacitor electrode 74a and the lead-out line 74h are formed from gate metal GM.

As to the TFT 71 arranged as above, if it is found out by an inspection conducted after manufacturing that leakage has occurred in the capacitor 71a due to a leakage defect L2 caused between at least one of the first capacitor electrodes 72a and the second capacitor electrode 74a or for other reasons, the first capacitor electrode 72a having the leakage. defect L2 is electrically separated from the lead-out line 72h. Specifically, the lead-out line 72h is provided at a distance from a region above the second capacitor electrode 74a in the thickness direction. The first capacitor electrode 72a having the leakage defect L2 is laser-fused at a point Q2. The point Q2 lies on the first capacitor electrode 72a of interest in the range extending from the lead-out line 72h to the region above the second capacitor electrode 74a in the thickness direction. In this manner, the first capacitor electrode 72a having the leakage defect L2 is separated from the lead-out line 72h. The inspection may be an electrical inspection or a visual inspection. If it is difficult to localize the leakage defect 72h in any of the first capacitor electrodes 72a by the electrical inspection, the visual inspection is useful.

In the first capacitor electrode 72a, a cutout 73 may be provided in the first capacitor electrode 72a at an overlap boarder where the first capacitor electrode 72a extending from the lead-out line 72h side overlaps with the second capacitor electrode 74a. Additionally, cutouts 74 and 75 may be provided in a branch point of the lead-out line 72h from which point the first capacitor electrode 72a is branched off, at two spots adjoining the first capacitor electrode 72a. This makes it easy to determine a spot that can be laser-fused, by following the cutouts 73, 74, and 75 as markings. Note that the cutout 73 may be provided in plurality at the same first capacitor electrode 72a, and the cutouts 74 and 75 may be provided in the first capacitor electrode 72a.

Capacitances provided between the first capacitor electrodes 72a and the second capacitor electrode 74a (hereinafter referred to as partial capacitances) are connected in parallel to each other. These capacitances constitute the total capacitance of the capacity 71a in its entirety (hereinafter referred to as total capacitance). If these partial capacitances are sufficiently small as compared with the total capacitance, separation of a small number of the first capacitor electrodes 72a with the leakage defect L2 from the lead-out line 72h causes negligible difference in total capacitance between before and after separation of the first capacitor electrodes 72a.

Thus, the occurrence of leakage in the TFT 71 does not mean a failure of the entire TFT 71. Such a TFT 71 is serviceable by repair to the capacitor 71a.

Example 3

Figure 4:
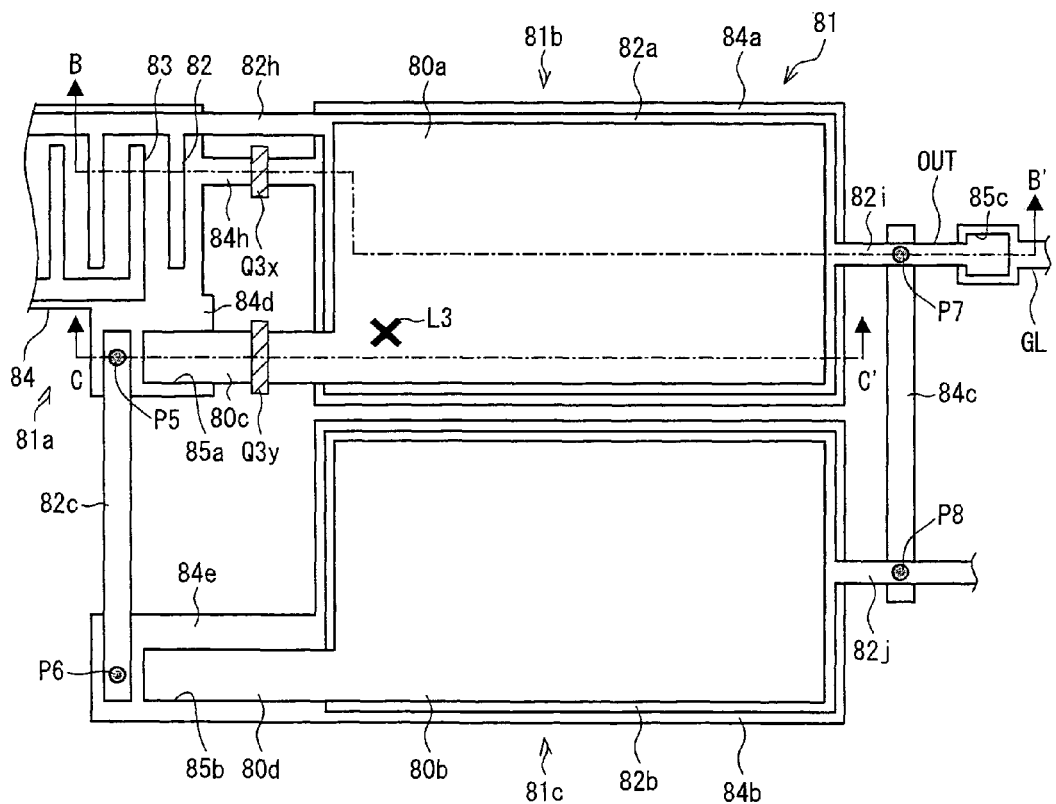
FIG. 4 is a plan view showing an embodiment of the present invention and showing the structure of a TFT according to a third example.
Figure 5:
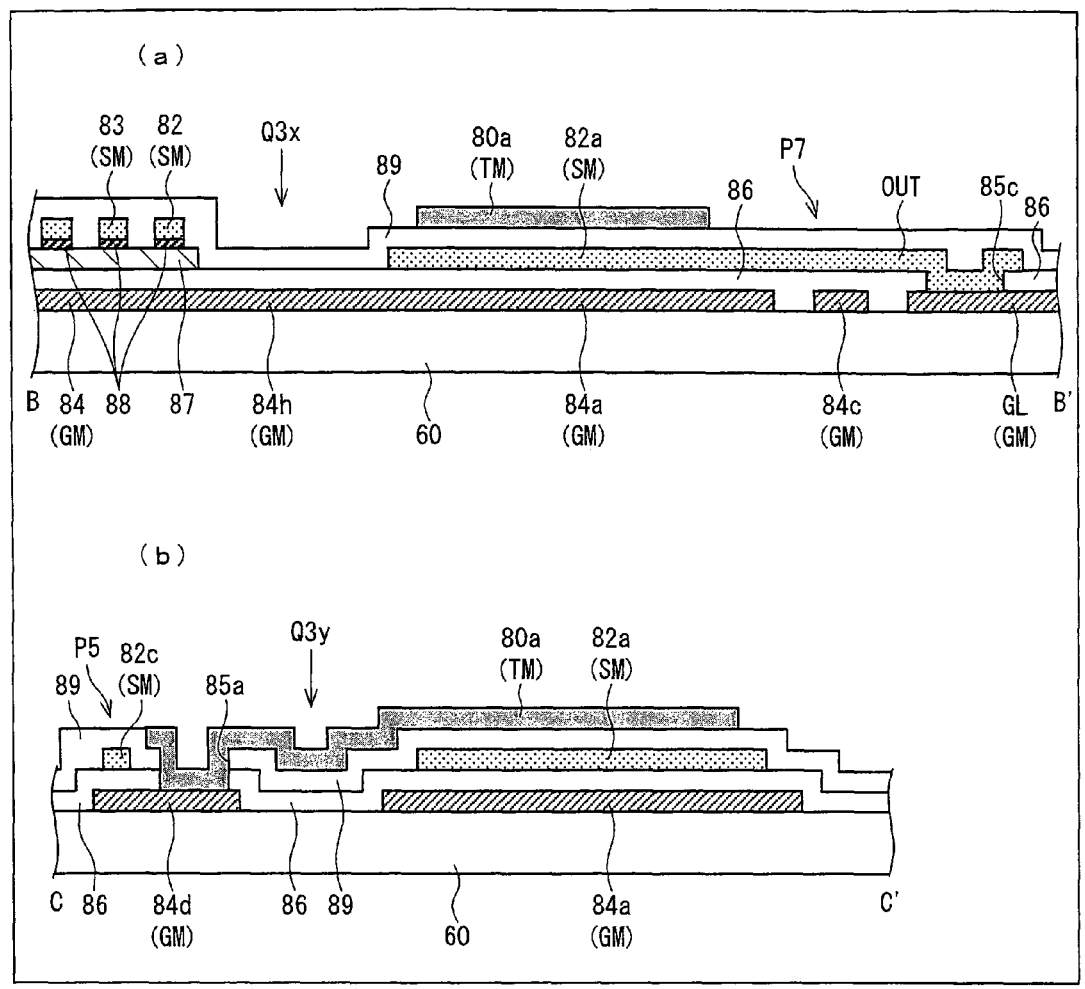
FIG. 5 shows cross-sectional views of the TFT shown in FIG. 4, wherein (a) is a cross-sectional view taken along the line B-B', and (b) is a cross-sectional view taken along the line C-C'.

The following will describe a TFT of the present example with reference to FIGS. 4 and 5.

FIG. 4 shows a plan view of the structure of a TFT 81 applicable to the transistor Tr4 and provided on the display panel 2, according to the present example.

The TFT 81 includes a TFT body section 81a, capacitors 81b and 81c, and interconnections 82c and 84c. Each of the capacitors 81b and 81c is a capacitor capable of serving as a bootstrap capacitor and applicable to the capacitor CAP.

The TFT body section 81a has a comb-shaped source electrode 82 and a comb-shaped drain electrode 83 disposed above a gate electrode 84 in a thickness direction, and opposed to each other in a panel plane in such a manner that the source electrode 82 and drain electrode 83 are engaged with each other, which secures a large channel width. However, this is merely one arrangement example. The source electrode 82, the drain electrode 83, and the gate electrode 84 may be disposed at any positions with any shapes.

The capacitor 81b is formed so as to have a region where a first capacitor electrode 82a and a second capacitor electrode 84a are arranged to be stacked in the thickness direction and mutually opposed across a gate dielectric layer (first dielectric layer, see FIG. 5) 86 therebetween. The capacitor 81b is also formed so as to have a region where the first capacitor electrode 82a and a third capacitor electrode 80a are arranged to be stacked in the thickness direction and mutually opposed across a passivation layer (second dielectric layer, see FIG. 5) 89 therebetween, with a coupling between the first capacitor electrode 82a and the third capacitor electrode 80a and a coupling between the first capacitor electrode 82a and the second capacitor electrode 84a formed over mutually opposite faces of the first capacitor electrode 82a. The first capacitor electrode 82a is formed so as to be led out from the source electrode 82 of the TFT body section 81a through a lead-out line 82h in a planar direction. The second capacitor electrode 84a is formed so as to be led out from the gate electrode 84 of the TFT body section 81a through a lead-out line (second lead-out line) 84h in a planar direction. The third capacitor electrode 80a is formed from a transparent electrode (see FIG. 5) TM. From the third capacitor electrode 80a, a lead-out line (third lead-out line) 80c is led out, and the lead-out line 80c is connected via a contact hole 85a to a lead-out line 84d that has been led out from the gate electrode 84 in a planar direction.

The first capacitor electrode 82a is connected to an output OUT of the shift register stage SR via a lead-out line (first lead-out line) 82i in a planar direction. The output OUT is connected via a contact hole 85c to the gate bus line GL which lies at a lower position in the thickness direction.

The capacitor 81c is disposed adjacent to the capacitor 81b and formed so as to have a region where a fourth capacitor electrode 82b and a fifth capacitor electrode 84b are arranged to be stacked in the thickness direction and mutually opposed across a gate dielectric layer (third dielectric layer) 86 therebetween. The capacitor 81c is also formed so as to have a region where the fourth capacitor electrode 82b and a sixth capacitor electrode 80b are arranged to be stacked in the thickness direction and mutually opposed across a passivation layer (fourth dielectric layer) 89 therebetween, with a coupling between the fourth capacitor electrode 82b and the sixth capacitor electrode 80b and a coupling between the fourth capacitor electrode 82b and the fifth capacitor electrode 84b formed over mutually opposite faces of the fourth capacitor electrode. The first dielectric layer and the third dielectric layer may be dielectric layers different from each other. Also, the second dielectric layer and the fourth dielectric layer may be dielectric layers different from each other. The sixth capacitor electrode 80b is formed from a transparent electrode (see FIG. 5) TM. From the sixth capacitor electrode 80b, a lead-out line 80d is led out in a planar direction. The lead-out line 80d is connected via a contact hole 85b to a lead-out line (fifth lead-out line) 84e, which is led out from the fifth capacitor electrode 84b in a planar direction. Further, from the fourth capacitor electrode 82b, a lead-out line (fourth lead-out line) 82j is led out in a planar direction.

In this case, the capacitors 81b and 81c are designed so as to have the same value of capacitance.

The interconnection (first interconnection) 82c is provided so as to intersect both of the lead-out lines 84d and 84e at upper positions in the thickness direction. The interconnection (second interconnection) 84c is provided so as to intersect both of the lead-out lines 82i and 82j at lower positions in the thickness direction.

(a) of FIG. 5 shows a cross-sectional view taken along the line B-B' in FIG. 4, and (b) of FIG. 5 shows a cross-sectional view taken along the line C-C' in FIG. 4.

As shown in the cross-sectional views in FIG. 5, the arrangement in FIG. 4 is such that: a gate metal GM, the gate dielectric layer 86, an i layer 87 formed from Si, an n+ layer 88 formed from Si, a source metal SM, a passivation layer 89, and a transparent electrode TM are stacked on a glass substrate 60 in this order. The gate electrode 84, the second capacitor electrode 84a, the lead-out line 84d, the interconnection 84c, and the gate bus line GL are all formed from the gate metal GM that has been formed in a concurrent manufacturing process. For example, the gate metal GM can be used in a single layer of Ta (or TaN), Ti (or TiN), Al (or an alloy whose major component is Al), Mo (or MoN), or Cr or used in a stack with any combinations of these metals. The source electrode 82, the drain electrode 83, the first capacitor electrode 82a, the lead-out line 82i, and the interconnection 82c are all formed from the source metal SM that has been formed in the concurrent manufacturing process. The source metal SM can be formed from the same materials) as the material(s) for the gate metal GM. For example, the source metal SM can be used in a single layer of Ta (or TaN), Ti (or TiN), Al (or an alloy whose major component is Al), Mo (or MoN), or Cr or used in a stack with any combinations of these metals. Further, both of the third capacitor electrode 80a and the sixth capacitor electrode 80b are formed from the transparent electrode TM that has been formed at a time with the transparent electrode TM for pixel electrode in the manufacturing process. As the transparent electrode TM, for example, ITO (Indium Tin Oxide), IZO (Indium Zinc Oxide), or the like can be used.

As the gate dielectric layer 86, for example, SiN or $SiO_2$, or the like can be used. As the passivation layer 89, for example, SiN, $SiO_2$, an organic resin film, or the like material can be used.

The i layer 87 is a layer that serves as a channel forming region in the TFT body section 81a. The n+ layer 88 is provided as a source/drain contact layer between the i layer 87 and the source electrode 82 and between the i layer 87 and the drain electrode 83.

Besides, in FIG. 4, the fifth capacitor electrode 84b and the lead-out line 84e are formed from the gate metal GM, and the fourth capacitor electrode 82b and the lead-out lines 82h and 82j are formed from the source metal SM.

As to the TFT 81 arranged as above, during the manufacture of the TFT 81, the capacitor 81b is electrically connected to the TFT body section 81a through the lead-out lines 82h, 84h, and 80c, while the capacitor 81c is not electrically connected to the TFT body section 81a since the fourth capacitor electrode 82b and the fifth capacitor electrode 84b are not connected to the source electrode 82 and the gate electrode 84, respectively. If it is found out by an inspection conducted after manufacturing that leakage has occurred due to a leakage defect L1 between the first capacitor electrode 82a and the third capacitor electrode 80a, no voltage is applied to the capacitor 81b through both of the lead-out lines 82h and 84h and both of the lead-out lines 82h and 80c, and the capacitor 81c is made electrically connected to the TFT body section 81a through the lead-out line 82j and the interconnections 84c and 82c. The inspection may be an electrical inspection or a visual inspection.

Specifically, the interconnection 82c and the lead-out lines 84d and 84e are made connected to each other at intersection points P5 and P6 by laser welding, so that the fifth capacitor electrode 84b and the sixth capacitor electrode 80b are connected to the gate electrode 84, and the interconnection 84c and the lead-out lines 82i and 82j are made connected to each other at intersection points P7 and P8 by laser welding, so that the fourth capacitor electrode 82b is connected to the source electrode 82. Further, the lead-out line 84h is subjected to laser fusing at a midpoint Q3x, and the lead-out line 80c is subjected to laser fusing at a midpoint Q3y, so that the second capacitor electrode 84a and the third capacitor electrode 80a are separated from the gate electrode 84.

Thus, the occurrence of leakage in the capacitor 81b of the TFT 81 does not mean a failure of the entire TFT 81. Such a TFT 81 is serviceable with the capacitor 81c used as an alternative bootstrap capacitor.

Figure 12:
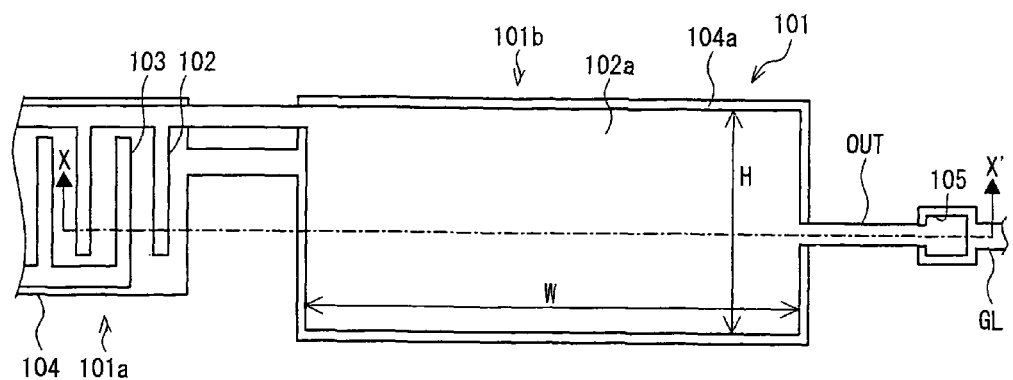
FIG. 12 is a plan view showing the conventional art and showing the structure of a TFT.
Figure 13:
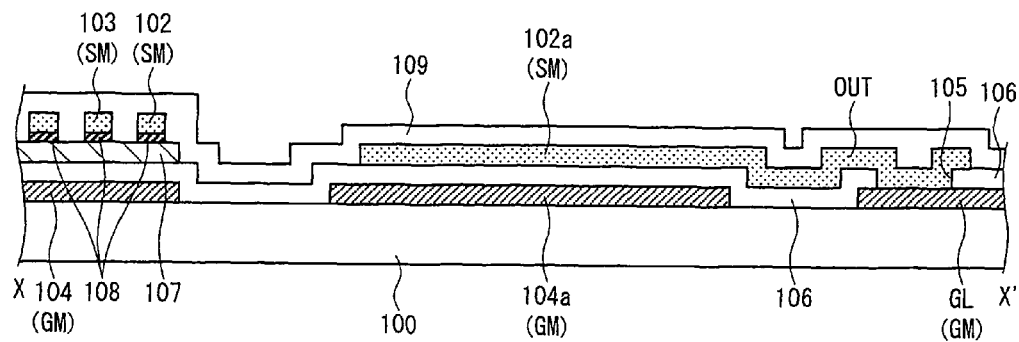
FIG. 13 is a cross-sectional view taken along the line X-X' in FIG. 12.

Further, the capacitor 81b is arranged such that capacitance formed between the first capacitor electrode 82a and the second capacitor electrode 84a are connected in parallel to capacitance formed between the first capacitor electrode 82a and the third capacitor electrode 80a. Still further, the capacitor 81c is arranged such that capacitance formed between the fourth capacitor electrode 82b and the fifth capacitor electrode 84b are connected in parallel to capacitance formed between the fourth capacitor electrode 82b and the sixth capacitor electrode 80b. Therefore, under the conditions where the gate dielectric layer 86 is equal in thickness to the passivation layer 89, a footprint of each of the capacitors 81b and 81c on the panel, which area is determined by H×W in FIG. 12c, can be reduced to about one half, as compared with the conventional arrangement without parallel connection. Further, under the conditions where a layer thickness of the passivation layer 89 is one half of that of the gate dielectric layer 86, a footprint of each of the capacitors 81b and 81c can be reduced to about one third, as compared to the conventional arrangement without parallel connection. Consequently, the alternative capacitor can be formed to address the occurrence of leakage, without increase of a footprint of the entire capacitor element occupied on the panel.

Note that the alternative capacitor like the capacitor 81c is not limited to one alternative capacitor. Alternatively, a plurality of alternative capacitors may be provided. In this case, one available alternative capacitor can be selected from among them for use at the occurrence of leakage.

Example 4

A TFT of the present example will be described with reference to FIG. 6. Unless otherwise noted, members given the same reference numerals as those shown in FIGS. 4 and 5 have the same functions as the members in FIGS. 4 and 5.

Figure 6:
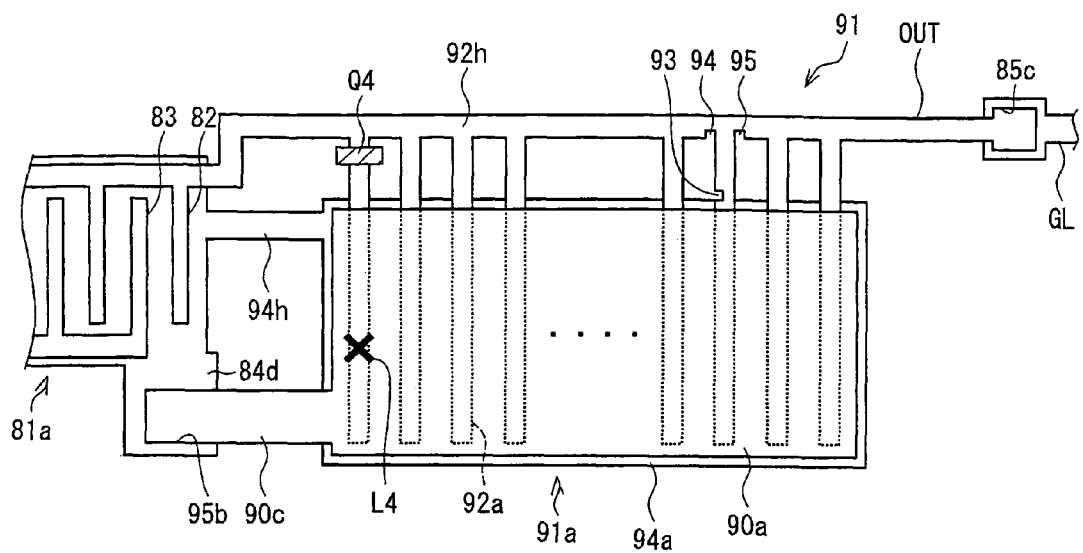
FIG. 6 is a plan view showing an embodiment of the present invention and showing the structure of a TFT according to a fourth example.

FIG. 6 shows a plan view of the structure of a TFT 91 applicable to the transistor Tr4 and provided on the display panel 2, according to the present example.

The TFT 91 includes a TFT body section 81a, a capacitor 91a, and interconnections 92h and 94h. The capacitor 91a is a capacitor capable of serving as a bootstrap capacitor and applicable to the capacitor CAP.

The capacitor 91b is formed so as to have a region where a plurality of first capacitor electrodes 92a and a second capacitor electrode 94a are arranged to be stacked in a thickness direction and mutually opposed across a gate dielectric layer (first dielectric layer) 86 therebetween. The capacitor 91b is also formed so as to have a region where the plurality of first capacitor electrodes 92a and a third capacitor electrode 90a are arranged to be stacked in a thickness direction and mutually opposed across a passivation layer (second dielectric layer) 89 therebetween, with a coupling between the first capacitor electrode 92a and the third capacitor electrode 90a and a coupling between the first capacitor electrode 92a and the second capacitor electrode 94a formed over mutually opposite faces of the first capacitor electrode. The plurality of first capacitor electrodes 92a are formed so as to be led out from the lead-out line 92h, which is led out from the source electrode 82 of the TFT body section 81a, and to be branched off in a comb-like manner in a planar direction. The second capacitor electrode 94a is formed so as to be led out from the gate electrode 84 of the TFT body section 81a through a lead-out line 94h in a planar direction. From the third capacitor electrode 90a, a lead-out line 90c is led out, and the lead-out line 90c is connected via a contact hole 95b to a lead-out line 84d.

The lead-out line 92h is connected to an output OUT of the shift register stage SR, and the output OUT is connected via a contact hole 85c to the gate bus line GL which lies at a lower position in the thickness direction.

The plurality of first capacitor electrode 92a and the lead-out line 92h are formed from source metal SM, and the second capacitor electrode 94a and the lead-out line 94h are formed from gate metal GM. The third capacitor electrode 90a is formed from a transparent electrode TM.

As to the TFT 91 arranged as above, if it is found out by an inspection conducted after manufacturing that leakage has occurred in the capacitor 91a due to a leakage defect L4 caused between at least one of the first capacitor electrodes 92a and the second capacitor electrode 94a or between at least one of the first capacitor electrodes 92a and the third capacitor electrode 90a, or for other reasons, the first capacitor electrode 92a having the leakage defect L4 is electrically separated from the lead-out line 92h. Specifically, the lead-out line 92h is provided at a distance from a region above the second capacitor electrode 94a in the thickness direction and from a region below the third capacitor electrode 90a in the thickness direction. The first capacitor electrode 92a having the leakage defect L4 is laser-fused at a point Q4. The point Q4 lies on the first capacitor electrode 92a of interest in the range extending from the lead-out line 92h to either region closer to the lead-out line 92h of (i) the region above the second capacitor electrode 94a in the thickness direction and (ii) the region below the third capacitor electrode 90a in the thickness direction. In this manner, the first capacitor electrode 92a having the leakage defect L4 is separated from the lead-out line 92h. The inspection may be an electrical inspection or a visual inspection. If it is difficult to localize the leakage defect 92h in any of the first capacitor electrodes 92a by the electrical inspection, the visual inspection is useful.

In the first capacitor electrode 92a, a cutout 93 may be provided in the first capacitor electrode 92a at an overlap boarder where the first capacitor electrode 92a extending from the lead-out line 92h side overlaps with either of the second capacitor electrode 94a and the third capacitor electrode 90a closer to the lead-out line 92h. Additionally, cutouts 94 and 95 may be provided in a branch point of the lead-out line 72h from which point the first capacitor electrode 92a is branched off, at two spots adjoining the first capacitor electrode 92a. This makes it easy to determine a place that can be laser-fused, by following the cutouts 93, 94, and 95 as markings. Note that the cutout 93 may be provided in plurality at the same first capacitor electrode 92a, and the cutouts 94 and 95 may be provided in the first capacitor electrode 92a.

Capacitances provided between the first capacitor electrodes 92a and the second capacitor electrode 94a (hereinafter referred to as first partial capacitances) are connected in parallel to each other. In addition, capacitances provided between the first capacitor electrodes 92a and the third capacitor electrode 90a (hereinafter referred to as second partial capacitances) are connected in parallel to each other. These capacitances constitute the total capacitance of the capacity 91a in its entirety (hereinafter referred to as total capacitance). If a sum of the first and second partial capacitances is sufficiently small as compared with the total capacitance, separation of a small number of the first capacitor electrodes 92a with the leakage defect L4 from the lead-out line 92h causes negligible difference in total capacitance between before and after separation of the first capacitor electrodes 92a.

Thus, the occurrence of leakage in the capacitor 91a of the TFT 91 does not mean a failure of the entire TFT 91. Such a TFT 91 is serviceable by repair to the capacitor 91a.

Further, the capacitor 91b is arranged such that capacitances formed between the first capacitor electrodes 92a and the second capacitor electrode 94a are connected in parallel to capacitances formed between the first capacitor electrodes 92a and the third capacitor electrode 80a. Therefore, a total area of the plurality of comb-shaped first capacitor electrodes 92a can be made smaller than electrode areas of a bootstrap capacitor in the form of a single normal parallel plate capacitor, without increase of a footprint of the entire capacitor element occupied on the panel.

All of the examples have been described above. In Examples 1 and 2, the source metal SM is located at an upper position than the gate metal GM when viewed in the thickness direction. However, this is not the only possibility. Alternatively, the source metal SM may be located at a lower position than the gate metal GM when viewed in the thickness direction. Further, in Examples 3 and 4, the locations of the gate metal GM and the transparent electrode TM may be reversed as long as the source metal SM is provided between the gate metal GM and the transparent electrode TM.

Further, gate drivers can be provided so as to adjoin to opposite sides of the display region 2a or to adjoin to one of the opposite sides of the display region 2a. Thus, the gate driver(s) may be positioned at a desired place(s).

Still further, the TFT may be used at any spot in a display device, or may be used at a place other than the display device.

Yet further, the present invention can be applied to any other display devices such as an electroluminescent display device, without limitation to a liquid crystal display device.

The present invention is not limited to the aforementioned embodiments and is susceptible of various changes within the scope of the accompanying claims. Also, an embodiment obtained by suitable combinations of technical means disclosed in the different embodiments are also included within the technical scope of the present invention.

INDUSTRIAL APPLICABILITY

The present invention can be suitably used for a display device including a TFT.

The invention claimed is:

1. A TFT comprising:
a first capacitor formed so as to have a region where a first capacitor electrode connected to a source electrode and a second capacitor electrode are arranged to be stacked in a thickness direction and mutually opposed across a first dielectric layer therebetween;
a second capacitor formed so as to have a region where a third capacitor electrode and a fourth capacitor electrode are arranged to be stacked in the thickness direction and mutually opposed across a second dielectric layer therebetween;
a first lead-out line led out from the first capacitor electrode in a planar direction;
a second lead-out line led out from a gate electrode in a planar direction;
a third lead-out line out from the third capacitor electrode in a planar direction;
a fourth lead-out line led out from the fourth capacitor electrode in a planar direction;
a first interconnection intersecting the second lead-out line and the fourth lead-out line when viewed in the thickness direction; and
a second interconnection intersecting the first lead-out line and the third lead-out line when viewed in the thickness direction,
the second capacitor electrode and the gate electrode being connected to each other via the second lead-out line,
the third capacitor electrode and the source electrode not being connected to each other,
the fourth capacitor electrode and the gate electrode not being connected to each other.

2. A TFT comprising:
a first capacitor formed so that a first capacitor electrode connected to a source electrode and a second capacitor electrode are arranged to be stacked in a thickness direction and mutually opposed across a first dielectric layer therebetween;
a second capacitor formed so that a third capacitor electrode and a fourth capacitor electrode are arranged to be stacked in the thickness direction and mutually opposed across a second dielectric layer therebetween;
a first lead-out line led out from the first capacitor electrode in a planar direction;
a second lead-out line led out from a gate electrode in a planar direction;
a third lead-out line led out from the third capacitor electrode in a planar direction;
a fourth lead-out line led out from the fourth capacitor electrode in a planar direction;
a first interconnection intersecting the second lead-out line and the fourth lead-out line when viewed in the thickness direction; and
a second interconnection intersecting the first lead-out line and the third lead-out line when viewed in the thickness direction,
the second capacitor electrode and the gate electrode not being connected to each other,
the first lead-out line and the third lead-out line being connected to the second interconnection, whereby the third capacitor electrode and the source electrode are connected to each other,
the second lead-out line and the fourth lead-out line being connected to the first interconnection, whereby the fourth capacitor electrode and the gate electrode are connected to each other.

3. The TFT according to claim 1, wherein
the first capacitor electrode, the third capacitor electrode, the first lead-out line, the third lead-out line, and the first interconnection are formed from source metal, and
the second capacitor electrode, the fourth capacitor electrode, the second lead-out line, the fourth lead-out line, and the second interconnection are formed from gate metal.

4. The TFT according to claim 1, wherein
each of the first dielectric layer and the second dielectric layer is a gate dielectric layer.

5. A TFT comprising:
a lead-out line connected to a source electrode; and
a capacitor formed so as to have a region where a plurality of first capacitor electrodes and a second capacitor electrode connected to a gate electrode are arranged to be stacked in a thickness direction and mutually opposed across a dielectric layer therebetween, the plurality of first capacitor electrodes being led out from the lead-out line so as to be branched off from the lead-out line in a planar direction.

6. The TFT according to claim 5,
each of the first capacitor electrodes has: a pairing portion forming an opposing pair with the second electrode which is in the region of the capacitor; and a non-pairing portion with the second electrode such that the non-pairing portion extends from the lead-out line and leads to the pairing portion.

7. The TFT according to claim 6, wherein
a cutout is provided in the first capacitor electrode at a boundary between the non-pairing portion and the pairing portion and/or provided in the lead-out line at a place where the first capacitor electrode is branched off from the lead-out line.

8. The TFT according to claim 5, wherein
the first capacitor electrodes and the lead-out line are formed from source metal, and
the second capacitor electrode is formed from gate metal.

9. The TFT according to claim 5, wherein
the dielectric layer is a gate dielectric layer.

10. A TFT comprising:
a first capacitor formed: so as to have a region where a first capacitor electrode connected to a source electrode and a second capacitor electrode are arranged to be stacked in a thickness direction and mutually opposed across a first dielectric layer therebetween; and so as to have a region where the first capacitor electrode and a third capacitor electrode are arranged to be stacked in the thickness direction and mutually opposed across a second dielectric layer therebetween with a coupling between the first capacitor electrode and the third capacitor electrode and a coupling between the first capacitor electrode and the second capacitor electrode formed over mutually opposite faces of the first capacitor electrode;
a second capacitor formed: so as to have a region where a fourth capacitor electrode and a fifth capacitor electrode are arranged to be stacked in the thickness direction and mutually opposed across a third dielectric layer therebetween; and so as to have a region where the fourth capacitor electrode and a sixth capacitor electrode are arranged to be stacked in the thickness direction and mutually opposed across a fourth dielectric layer therebetween with a coupling between the fourth capacitor electrode and the sixth capacitor electrode and a coupling between the fourth capacitor electrode and the fifth capacitor electrode formed over mutually opposite faces of the fourth capacitor electrode;
a first lead-out line led out from the first capacitor electrode in a planar direction;
a second lead-out line led out from the second capacitor electrode in a planar direction;
a gate lead-out line led out from a gate electrode in a planar direction;
a third lead-out line led out from the third capacitor electrode in a planar direction;
a fourth lead-out line led out from the fourth capacitor electrode in a planar direction;
a fifth lead-out line led out from the fifth capacitor electrode in a planar direction;
a first interconnection intersecting the gate lead-out line and the fifth lead-out line when viewed in the thickness direction; and
a second interconnection intersecting the first lead-out line and the fourth lead-out line when viewed in the thickness direction,
the third capacitor electrode and the gate electrode being connected to each other via the third lead-out line,
the sixth capacitor electrode being connected to the fifth lead-out line,
the second capacitor electrode and the gate electrode being connected to each other via the second lead-out line,
the gate lead-out line and the fifth lead-out line not being connected to the first interconnection,
the first lead-out line and the fourth lead-out line not being connected to the second interconnection.

11. A TFT comprising:
a first capacitor formed: so as to have a region where a first capacitor electrode connected to a source electrode and a second capacitor electrode are arranged to be stacked in a thickness direction and mutually opposed across a first dielectric layer therebetween; and so as to have a region where the first capacitor electrode and a third capacitor electrode are arranged to be stacked in the thickness direction and mutually opposed across a second dielectric layer therebetween with a coupling between the first capacitor electrode and the third capacitor electrode and a coupling between the first capacitor electrode and the second capacitor electrode formed over mutually opposite faces of the first capacitor electrode;
a second capacitor formed: so as to have a region where a fourth capacitor electrode and a fifth capacitor electrode are arranged to be stacked in the thickness direction and mutually opposed across a third dielectric layer therebetween; and so as to have a region where the fourth capacitor electrode and a sixth capacitor electrode are arranged to be stacked in the thickness direction and mutually opposed across a fourth dielectric layer therebetween with a coupling between the fourth capacitor electrode and the sixth capacitor electrode and a coupling between the fourth capacitor electrode and the fifth capacitor electrode formed over mutually opposite faces of the fourth capacitor electrode;
a first lead-out line led out from the first capacitor electrode in a planar direction;
a second lead-out line led out from the second capacitor electrode in a planar direction;
a gate lead-out line led out from a gate electrode in a planar direction;
a third lead-out line led out from the third capacitor electrode in a planar direction;
a fourth lead-out line led out from the fourth capacitor electrode in a planar direction;
a fifth lead-out line led out from the fifth capacitor electrode in a planar direction;
a first interconnection intersecting the gate lead-out line and the fifth lead-out line when viewed in the thickness direction; and
a second interconnection intersecting the first lead-out line and the fourth lead-out line when viewed in the thickness direction,
the third capacitor electrode and the gate electrode not being connected to each other,
the sixth capacitor electrode being connected to the fifth lead-out line,
the second capacitor electrode and the gate electrode not being connected to each other,
the gate lead-out line and the fifth lead-out line being connected to the first interconnection, whereby the fifth capacitor electrode and the sixth electrode are connected to the gate electrode,
the first lead-out line and the fourth lead-out line being connected to the second interconnection, whereby the fourth capacitor electrode and the source electrode are connected to each other.

12. The TFT according to claim 10, wherein
the first capacitor electrode, the fourth capacitor electrode, the first lead-out line, the fourth lead-out line, and the first interconnection are formed from source metal,
the second capacitor electrode, the fifth capacitor electrode, the second lead-out line, the fifth lead-out line, the gate lead-out line, and the second interconnection are formed from gate metal, and
the third capacitor electrode, the sixth capacitor electrode, and the third lead-out line are formed from transparent electrodes.

13. The TFT according to claim 10, wherein
each of the first dielectric layer and the third dielectric layer is a gate dielectric layer, and
each of the second dielectric layer and the fourth dielectric layer is a passivation layer.

14. A TFT comprising:
a lead-out line connected to a source electrode; and
a capacitor formed: so as to have a region where a plurality of first capacitor electrodes and a second capacitor electrode connected to a gate electrode are arranged to be stacked in a thickness direction and mutually opposed across a first dielectric layer therebetween, the plurality of first capacitor electrodes being led out from the lead-out line so as to be branched off from the lead-out line in a planar direction; and so as to have a region where the first capacitor electrodes and a third capacitor electrode connected to the gate electrode are arranged to be stacked in the thickness direction and mutually opposed across a second dielectric layer therebetween with a coupling between the first capacitor electrodes and the third capacitor electrode and a coupling between the first capacitor electrodes and the second capacitor electrode formed over mutually opposite faces of the first capacitor electrode.

15. The TFT according to claim 14,
each of the first capacitor electrodes has: a pairing portion forming an opposing pair with either of the second and third capacitor electrodes closer to the lead-out line which electrodes are in the region of the capacitor; and a non-pairing portion with the second and third electrodes such that the non-pairing portion extends from the lead-out line and leads to the pairing portion.

16. The TFT according to claim 15, wherein
a cutout is provided in the first capacitor electrode at a boundary between the non-pairing portion and the pairing portion and/or provided in the lead-out line at a place where the first capacitor electrode is branched off from the lead-out line.

17. The TFT according to claim 14, wherein
the first capacitor electrode and the lead-out line are formed from source metal,
the second capacitor electrode is formed from gate metal, and
the third capacitor electrode is formed from a transparent electrode.

18. The TFT according to claim 14, wherein
the first dielectric layer is a gate dielectric layer, and
the second dielectric layer is a passivation layer.

19. The TFT according to claim 1, wherein
the TFT is manufactured with use of amorphous silicon.

20. The TFT according to claim 1, wherein
the TFT is manufactured with use of microcrystalline silicon.

21. A shift register including a plurality of stages composed of transistors, wherein
at least one of the transistors is a TFT according to claim 1.

22. A scanning signal line drive circuit including a shift register according to claim 21, wherein
the shift register is used to generate a scan signal for a display device.

23. The scan signal line driving circuit according to claim 22, wherein
the TFT is an output transistor that outputs the scan signal.

24. A display device, comprising a scan signal line driving circuit according to claim 22.

25. The display device according to claim 24, wherein
the scan signal line driving circuit is formed on a display panel so as to be monolithically integrated with a display region.

26. A display device, comprising a display panel in which a TFT according to claim 1 is formed.

27. A method for trimming a TFT according to claim 1, the method, comprising:
causing separation between the second capacitor electrode and the gate electrode by fusing the second lead-out line;
causing the first lead-out line and the third lead-out line to be connected to the second interconnection by welding; and
causing the second lead-out line and the fourth lead-out line to be connected to the first interconnection by welding.

28. A method for trimming a TFT according to claim 5, the method, comprising:
causing disconnection of at least one of the first capacitor electrodes from the lead-out line by fusing.

29. A method for trimming a TFT according to claim 10, the method, comprising:
causing separation between the third capacitor electrode and the gate electrode by fusing the third lead-out line;
causing the sixth capacitor electrode to be connected to the fifth lead-out line by welding;
causing separation between the second capacitor electrode and the gate electrode by fusing the second lead-out line;
causing the gate lead-out line and the fifth lead-out line to be connected to the first interconnection by welding; and
causing the first lead-out line and the fourth lead-out line to be connected to the second interconnection by welding.

* * * * *